(12) United States Patent
Tocornal et al.

(10) Patent No.: US 10,909,446 B2
(45) Date of Patent: Feb. 2, 2021

(54) SYSTEMS AND METHODS FOR SELECTING GLOBAL CLIMATE SIMULATION MODELS FOR TRAINING NEURAL NETWORK CLIMATE FORECASTING MODELS

(71) Applicant: ClimateAI, Inc., San Francisco, CA (US)

(72) Inventors: Matias Castillo Tocornal, Palo Alto, CA (US); Brent Donald Lunghino, Somerville, MA (US); Maximilian Cody Evans, Oakland, CA (US); Carlos Felipe Gaitan Ospina, San Diego, CA (US); Aranildo Rodrigues Lima, Vancouver (CA)

(73) Assignee: ClimateAI, Inc., San Francisco, CA (US)

( * ) Notice: Subject to any disclaimer, the term of this patent is extended or adjusted under 35 U.S.C. 154(b) by 0 days.

(21) Appl. No.: 16/869,496

(22) Filed: May 7, 2020

(65) Prior Publication Data
US 2020/0356839 A1 Nov. 12, 2020

Related U.S. Application Data

(60) Provisional application No. 62/850,460, filed on May 20, 2019, provisional application No. 62/850,454, (Continued)

(51) Int. Cl.
*G06N 3/04* (2006.01)
*G06N 3/063* (2006.01)
(Continued)

(52) U.S. Cl.
CPC ............ *G06N 3/0445* (2013.01); *G01W 1/10* (2013.01); *G06F 30/27* (2020.01); *G06K 9/6256* (2013.01);
(Continued)

(58) Field of Classification Search
CPC ...... G06N 3/0445; G06N 3/063; G06F 30/27; G01W 1/10; G01W 2201/00; G06K 9/6256; G06K 9/6262
See application file for complete search history.

(56) References Cited

U.S. PATENT DOCUMENTS 9,262,723 B2 2/2016 LuValle
10,558,925 B1 2/2020 Flor et al.
(Continued)

OTHER PUBLICATIONS

Baboo, S. Santhosh, and I. Kadar Shereef. "An efficient weather forecasting system using artificial neural network." International journal of environmental science and development 1.4 (2010): 321. (Year: 2010).*

(Continued)

*Primary Examiner* — Li B. Zhen
*Assistant Examiner* — Markus A. Vasquez
(74) *Attorney, Agent, or Firm* — American Patent Agency PC; Daniar Hussain; Xiaomeng Shi

(57) ABSTRACT

Methods and systems for generating a multi-model ensemble of global climate simulation data from a plurality of global climate simulation models (GCMs), to be used in training a neural network (NN)-based climate forecasting model, are disclosed. The methods and systems perform steps of computing a GCM validation measure for each GCM; selecting a validated subset of the GCMs, by comparing each computed GCM validation measure to a validation threshold determined based on observational historical climate data; computing a forecast skill score for each validated GCM, based on a first forecast function; selecting a validated and skillful subset of GCMs; generating one or more candidate ensembles by combining simulation data from at least two validated and skillful GCMs; computing an ensemble forecast skill score for each candidate ensemble, based on a second forecast function; and selecting a best- (Continued)

scored candidate ensemble. Embodiments of the present invention enable accurate climate forecasting without the need to run new dynamical global climate simulations on supercomputers.

18 Claims, 20 Drawing Sheets

Related U.S. Application Data filed on May 20, 2019, provisional application No. 62/845,482, filed on May 9, 2019.

(51) Int. Cl.
*G06K 9/62* (2006.01)
*G01W 1/10* (2006.01)
*G06F 30/27* (2020.01)

(52) U.S. Cl.
CPC .......... *G06K 9/6262* (2013.01); *G06N 3/063* (2013.01); *G01W 2201/00* (2013.01)

(56) References Cited

U.S. PATENT DOCUMENTS

| | | | |
|---|---|---|---|
| 2009/0138415 | A1 | 5/2009 | Lancaster |
| 2013/0325347 | A1 | 12/2013 | Giorgetti et al. |
| 2015/0193713 | A1 | 7/2015 | Giunta et al. |
| 2016/0379111 | A1 | 12/2016 | Bittner, Jr. et al. |
| 2017/0132537 | A1 | 5/2017 | Chavez |
| 2017/0176640 | A1* | 6/2017 | Kodra ............... G01W 1/10 |
| 2017/0261646 | A1 | 9/2017 | Liu et al. |
| 2017/0329048 | A1 | 11/2017 | Lemos et al. |
| 2018/0182083 | A1 | 6/2018 | Natroshvili et al. |
| 2019/0018918 | A1 | 1/2019 | Wood et al. |
| 2019/0228362 | A1 | 7/2019 | Anagnostou et al. |
| 2019/0230875 | A1 | 8/2019 | Mewes et al. |
| 2019/0254242 | A1 | 8/2019 | Allen et al. |
| 2020/0242400 | A1* | 7/2020 | Perkins ............. G06K 9/6256 |

OTHER PUBLICATIONS

"Analogical models". Wikipedia version from Sep. 26, 2017. https://en.wikipedia.org/w/index.php?title=Analogical_models&oldid=802473404. Accessed Aug. 29, 2020. (Year: 2017).*

Kim, Sookyung, et al. "Deep-hurricane-tracker: Tracking and forecasting extreme climate events." 2019 IEEE Winter Conference on Applications of Computer Vision (WACV). IEEE, 2019. Added to IEEE Xplore Mar. 7, 2019. (Year: 2019).*

Cohen, Taco S., et al. "Spherical cnns." arXiv preprint arXiv:1801.10130 (2018). (Year: 2018).*

Vaswani, Ashish, et al. "Attention is all you need." Advances in neural information processing systems. 2017. (Year: 2017).*

Hinton, Geoffrey, Oriol Vinyals, and Jeff Dean. "Distilling the knowledge in a neural network." arXiv preprint arXiv:1503.02531 (2015). (Year: 2015).*

Glenis, Vassilis, et al. "A transient stochastic weather generator incorporating climate model uncertainty." Advances in Water Resources 85 (2015): 14-26. (Year: 2015).*

Ding et al., "Diagnosing secular variations in retrospective ENSO seasonal forecast skill using CMIP5 model-analogs," Geophysical Research Letters, Feb. 13, 2019.

Ding et al., "Skillful Climate Forecasts of the Tropical Indo-Pacific Ocean Using Model-Analogs," Journal of Climate, Jun. 15, 2018.

Kim et al., "Convolutional Neural Network (CNN) for the ENSO prediction in a perfect model framework," Geophysical Research Abstracts, Apr. 8-13, 2018.

Kirtman et al., "The North American Multi-Model Ensemble," Bulletin of the American Meteorological Society, Apr. 1, 2014.

Monteleoni et al., "Tracking Climate Models, Statistical Analysis and Data Mining," Jul. 8, 2011.

Christoph Frei, "Section 5: Forecast Evaluation and Skill Scores", Available at: http://www.atmos.albany.edu/daes/atmclasses/atm401/spring_2014/Scores1.pdf, 2013, pp. 1-45.

ClimateAI Inc, "SBIR Phase I: An Artificial Intelligence-Based Global Seasonal Forecasting System", Available at: https://www.nsf.gov/awardsearch/showAward?AWD_ID=2026025&HistoricalAwards=false, National Science Foundation, Aug. 26, 2020, pp. 1-2.

ClimateAI, "ClimateAI Awarded Competitive Grant from the National Science Foundation", Available at: https://medium.com/@ClimateAI/climateai-awarded-competitive-grant-from-the-national-science-foundation-34905197634f, Sep. 14, 2020, pp. 1-6.

WWRP/WGNE Joint Working Group on Forecast Verification Research, "Forecast Verification—Issues, Methods and FAQ", Available at: https://www.cawcr.gov.au/projects/verification/verif_web_page.html, Aug. 20, 2009, pp. 1-39.

* cited by examiner

550

TEMPERATURE ANOMALY 1980-04-01

580

NEURAL NETWORK LAYER

SIGMOID ACTIVATION

POINTWISE OPERATION

CONCATENATION

SYSTEMS AND METHODS FOR SELECTING GLOBAL CLIMATE SIMULATION MODELS FOR TRAINING NEURAL NETWORK CLIMATE FORECASTING MODELS

REFERENCE TO RELATED APPLICATIONS

This application is a non-provisional of and claims priority to provisional U.S. Ser. No. 62/845,482, filed on May 9, 2019, entitled "Systems and Methods for Selecting Global Climate Simulation Models for an Artificial Neural Network Climate Forecasting Model";

This application is a non-provisional of and claims priority to provisional U.S. Ser. No. 62/850,460, filed on May 20, 2019, entitled "Systems and Methods of Using Net-Bots for Neural Network Climate Forecasting Models"; and This application is a non-provisional of and claims priority to provisional U.S. Ser. No. 62/850,454, filed on May 20, 2019, entitled "Graphical User Interface Visualization of a Climate Forecasting Model for Selected Industry and Industry Related Variables."

The entire disclosures of all above-referenced applications are hereby incorporated by reference in their entireties herein.

NOTICE OF COPYRIGHTS AND TRADEDRESS

A portion of the disclosure of this patent document contains material which is subject to copyright protection. This patent document may show and/or describe matter which is or may become tradedress of the owner. The copyright and tradedress owner has no objection to the facsimile reproduction by anyone of the patent disclosure as it appears in the U.S. Patent and Trademark Office files or records, but otherwise reserves all copyright and tradedress rights whatsoever.

FIELD OF THE INVENTION

Embodiments of the present invention are in the field of climate forecasting, and pertain particularly to methods and systems for climate forecasting using an artificial neural network-based forecasting model.

BACKGROUND OF THE INVENTION

The statements in this section may serve as a background to help understand the invention and its application and uses, but may not constitute prior art.

Climate refers to the long-term average of weather conditions, where weather is the fluctuating state of the atmosphere as reflected in meteorological variables including temperature, wind speed, precipitation, and the like. Regional climate is the average weather pattern in a region over several decades, and global climate describes the climate of the Earth as averaged over regional differences. Weather changes on an hourly or daily scale, while climate change occurs over years, decades, centuries, and millennia. Accurate climate forecasting enables the anticipation and mitigation of extreme or disruptive climate events, and are of huge human and economic values to climate-sensitive sectors such as agriculture and energy.

Traditionally, climate forecasts have been produced using computationally intensive dynamical models, or statistical models that make limiting assumptions such as linearity between predictors and predictands. Dynamical models rely on fundamental physical principles and use mathematical equations to represent physical, chemical, and biological mechanisms that influence global climate, taking into account of climate system components such as atmospheric circulation, land coverage, ocean current circulation and biogeochemistry, atmosphere-ocean interactions including air-sea heat and water exchanges, and many external forcing factors. A dynamical climate model can be evaluated based on its hindcast skill against past observational historical data, to minimize uncertainty in forward climate forecasts. As more climate processes are incorporated into global climate models on finer spatial grids, and as more forcing scenarios are considered for climate change, supercomputers become essential in finding numerical approximations to mathematical questions that are too difficult to solve exactly. The computational complexity and the cumulative uncertainty in numerical modeling over long periods of time make it difficult to generate fast and robust long-lead forecasts with high accuracy. Hybrid dynamical and statistical models, as well as ensemble modeling have also been studied extensively to reduce forecast uncertainty by post-processing and combining climate projections from different forecasting models, yet such approaches often require even higher computational power.

More recently, advanced machine learning algorithms developed in other research fields and application areas have been suggested for climate analysis and other Earth System Science applications. Such data-driven approaches may attempt to learn spatial-temporal features from existing observational historical climate data, yet are generally constrained by the short observational record of climate data, which often have high spatial resolutions but short temporal durations. For example, the modern global instrumental record of surface air temperatures and ocean surface temperatures stretches back only to the late $19^{th}$ century.

Therefore, in view of the aforementioned difficulties, there is an unsolved need to develop a low-cost, fast, and robust climate forecasting system that can project climate trends and predict climate events with high accuracy while providing insights into complex underlying mechanisms.

It is against this background that various embodiments of the present invention were developed.

BRIEF SUMMARY OF THE INVENTION

Methods, systems, and apparatus are provided for climate forecasting using an artificial neural network-based climate forecasting model trained on global climate simulation data and fine-tuned on observational historical climate data.

In one aspect, one embodiment of the present invention is a method for generating a multi-model ensemble of global climate simulation data from a plurality of global climate simulation models (GCMs), to be used in training a neural network (NN)-based climate forecasting model. The method comprises the following steps. First, computing a GCM validation measure, for each of the plurality of GCMs, based on at least one sample statistic for at least one climate variable of simulation data from the GCM. Then, selecting a validated subset of the plurality of GCMs, by comparing each computed GCM validation measure to a validation threshold determined based on a first set of observational historical climate data. Then, computing a forecast skill score for each validated GCM, based on a first forecast function selected from the group consisting of a first data predictor function, the NN-based climate forecasting model, and a model analog of the NN-based climate forecasting model. Then, selecting a validated and skillful subset of GCMs by choosing at least two best-scored GCMs. Then, generating one or more candidate ensembles of global climate simulation data, by combining simulation data from at least two validated and skillful GCMs from the validated and skillful subset of GCMs. Then, computing an ensemble forecast skill score for each candidate ensemble, based on a second forecast function selected from the group consisting of a second ensemble-based data predictor function, the NN-based climate forecasting model, and a model analog of the NN-based climate forecasting model. Finally, generating the multi-model ensemble of global climate simulation data by selecting a best-scored candidate ensemble of global climate simulation data.

In one embodiment, the method further comprises determining a loss function for a neural network in the NN-based climate forecasting model based on a target output variable, wherein the NN-based climate forecasting model forecasts the target output variable at a target lead time; and determining a number of layers for the neural network based on the target lead time.

In one embodiment, the NN-based climate forecasting model is selected from the group consisting of a Convolutional Recurrent Neural Network (CRNN) having at least one Long Short-Term Memory (LSTM) layer, a Spherical Convolutional Neural Network ($S^2$-CNN), and a transformer neural network.

In one embodiment, the validation threshold is determined by computing the at least one sample statistic for the at least one climate variable from the first set of observational historical climate data.

In one embodiment, the method further comprises identifying the first data predictor function based on a target output variable and a target lead time, wherein the NN-based climate forecasting model forecasts the target output variable at the target lead time.

In one embodiment, the at least one climate variable is an input climate variable to the NN-based climate forecasting model, and wherein the NN-based climate forecasting model forecasts the target output variable at a target lead time from the input climate variable.

In one embodiment, the method further comprises training the NN-based climate forecasting model using the multi-model ensemble of global climate simulation data from the plurality of global climate simulation models (GCMs).

In one embodiment, the observational historical climate data comprises reanalysis data.

In one embodiment, the combining simulation data from at least two validated and skillful GCMs comprises at least one of concatenating and interleaving the simulation data from the at least two validated and skillful GCMs.

In another aspect, one embodiment of the present invention is a system for generating a multi-model ensemble of global climate simulation data from a plurality of global climate simulation models (GCMs), to be used in training a neural network (NN)-based climate forecasting model. The system comprises at least one processor; and a non-transitory physical storage medium for storing program code and accessible by the processor. The program code, when executed by the processor, causes the processor to perform the following computer-executable operations. First, compute a GCM validation measure, for each of the plurality of GCMs, based on at least one sample statistic for at least one climate variable of simulation data from the GCM. Then, select a validated subset of the plurality of GCMs, by comparing each computed GCM validation measure to a validation threshold determined based on a first set of observational historical climate data. Then, compute a forecast skill score for each validated GCM, based on a first forecast function selected from the group consisting of a first data predictor function, the NN-based climate forecasting model, and a model analog of the NN-based climate forecasting model. Then, select a validated and skillful subset of GCMs by choosing at least two best-scored GCMs. Then, generate one or more candidate ensembles of global climate simulation data, by combining simulation data from at least two validated and skillful GCMs from the validated and skillful subset of GCMs. Then, compute an ensemble forecast skill score for each candidate ensemble, based on a second forecast function selected from the group consisting of a second ensemble-based data predictor function, the NN-based climate forecasting model, and a model analog of the NN-based climate forecasting model. Finally, generate the multi-model ensemble of global climate simulation data by selecting a best-scored candidate ensemble of global climate simulation data.

In one embodiment, the program code when executed by the processor further causes the processor to determine a loss function for a neural network in the NN-based climate forecasting model based on a target output variable, wherein the NN-based climate forecasting model forecasts the target output variable at a target lead time; and determine a number of layers for the neural network based on the target lead time.

In one embodiment, the NN-based climate forecasting model is selected from the group consisting of a Convolutional Recurrent Neural Network (CRNN) having at least one Long Short-Term Memory (LSTM) layer, a Spherical Convolutional Neural Network ($S^2$-CNN), and a transformer neural network.

In one embodiment, the validation threshold is determined by computing the at least one sample statistic for the at least one climate variable from the first set of observational historical climate data.

In one embodiment, the program code when executed by the processor further causes the processor to identify the first data predictor function based on a target output variable and a target lead time, wherein the NN-based climate forecasting model forecasts the target output variable at the target lead time.

In one embodiment, the at least one climate variable is an input variable to the NN-based climate forecasting model, and wherein the NN-based climate forecasting model forecasts the target output variable at a target lead time from the input climate variable.

In one embodiment, the program code when executed by the processor further causes the processor to train the NN-based climate forecasting model using the multi-model ensemble of global climate simulation data from the plurality of global climate simulation models (GCMs).

In one embodiment, the observational historical climate data comprises reanalysis data.

In one embodiment, the program code to combine simulation data from at least two validated and skillful GCMs comprises program code for at least one of concatenating and interleaving the simulation data from the at least two validated and skillful GCMs.

In yet another aspect, one embodiment of the present invention is a non-transitory physical storage medium for generating a multi-model ensemble of global climate simulation data from a plurality of global climate simulation models (GCMs), to be used in training a neural network (NN)-based climate forecasting model. The storage medium comprising program code stored thereon which can be executed by a processor, which causes the processor to perform the following operations. First, compute a GCM validation measure, for each of the plurality of GCMs, based on at least one sample statistic for at least one climate variable of simulation data from the GCM. Then, select a validated subset of the plurality of GCMs, by comparing each computed GCM validation measure to a validation threshold determined based on a first set of observational historical climate data. Then, compute a forecast skill score for each validated GCM, based on a first forecast function selected from the group consisting of a first data predictor function, the NN-based climate forecasting model, and a model analog of the NN-based climate forecasting model. Then, select a validated and skillful subset of GCMs by choosing at least two best-scored GCMs. Then, generate one or more candidate ensembles of global climate simulation data, by combining simulation data from at least two validated and skillful GCMs from the validated and skillful subset of GCMs. Then, compute an ensemble forecast skill score for each candidate ensemble, based on a second forecast function selected from the group consisting of a second ensemble-based data predictor function, the NN-based climate forecasting model, and a model analog of the NN-based climate forecasting model. Finally, generate the multi-model ensemble of global climate simulation data by selecting a best-scored candidate ensemble of global climate simulation data.

In one embodiment, the NN-based climate forecasting model is selected from the group consisting of a Convolutional Recurrent Neural Network (CRNN) having at least one Long Short-Term Memory (LSTM) layer, a Spherical Convolutional Neural Network ($S^2$-CNN), and a transformer neural network.

Yet other aspects of the present invention include methods, processes, and algorithms comprising the steps described herein, and also include the processes and modes of operation of the systems and servers described herein. Other aspects and embodiments of the present invention will become apparent from the detailed description of the invention when read in conjunction with the attached drawings.

BRIEF DESCRIPTION OF THE DRAWINGS

Embodiments of the present invention described herein are exemplary, and not restrictive. Embodiments will now be described, by way of examples, with reference to the accompanying drawings, in which.

DETAILED DESCRIPTION OF THE INVENTION

Figure 1:
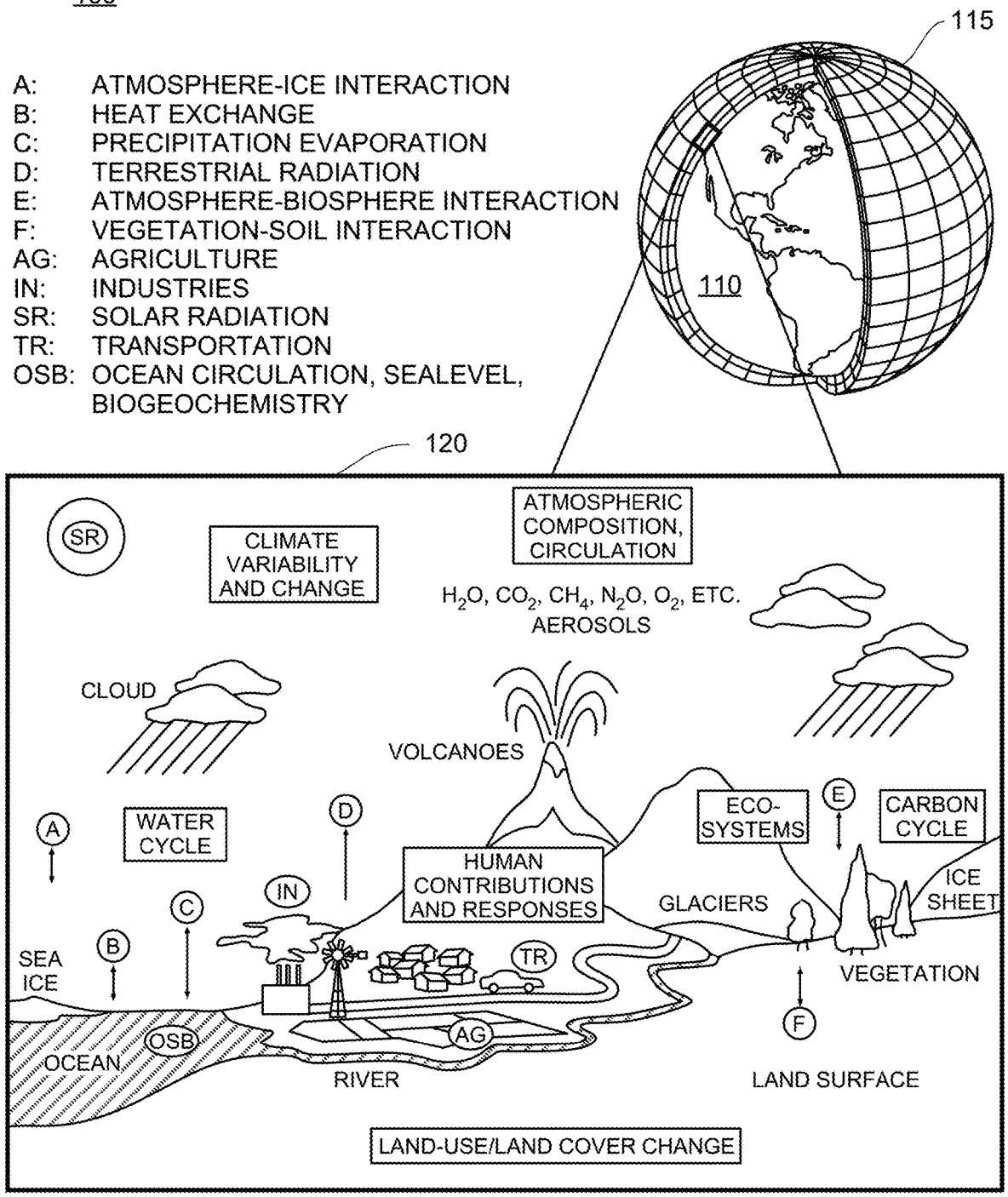
FIG. 1 is a schematic diagram illustrating grid cells used by a coupled atmospheric-ocean global climate model, and physical processes considered within each grid cell.

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or flow diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon the invention.

CLIMATEAI is a trademark name carrying embodiments of the present invention, and hence, the aforementioned trademark names may be interchangeably used in the specification and drawing to refer to the products/services offered by embodiments of the present invention. The term CLIMATEAI may be used in this specification to describe the overall climate forecasting platform, as well as the company providing said platform. With reference to the figures, embodiments of the present invention are now described in detail.

Introduction to Climate Forecasting and Overview of the CLIMATEAI System

The climate system is the fundamental natural heat engine that propels every aspect of the environment and human activity. Powered by radiations from the sun and influenced by various external forcing mechanisms, it drives complex physical and biogeochemical processes to maintain the basic conditions for the existence of life on the earth's surface. The global climate system has several interactive key components, including the atmosphere, the hydrosphere (surface water), the cryosphere (snow and ice), the lithosphere (soil and rocks), and the biosphere. Perturbations to and variations of the global climate system, on seasonal, annual, decadal and millennial scales, can have profound impacts on the environment and human's way of life. Accurate climate forecasting enables the anticipation and mitigation of extreme or disruptive climate events, and are of huge human and economic values to climate-sensitive sectors such as agriculture, energy, water resource management, and urban planning.

Meteorologists and climatologists attempting to predict climate trends are limited in the amount of real observational historical data, which comprises actual measurement of climate variables including, but not limited to, land temperature, sea temperature, arctic ice thickness, weather patterns, ocean current, surface open temperature, ambient air temperature, wave height, and storm severity. Real observational data do not exist for much of the earth's history. Only in about the last one hundred years have humans had means for measuring and recording many of these climate variables, and weather patterns that require complex instrumentations have not been recorded until recently. Additionally, a lack of understanding of factors impacting the climate also influences the amount of observational data available. For example, it is only within the last forty years that scientists have begun to understand the effects humans have on the climate and started recording more detailed measurements of certain climate variables and associated human factors.

Climate Forecasting Based on Global Climate Models

Conventional climate forecasting systems utilize computationally intensive dynamical general circulation models run on supercomputers with thousands of processors and petabytes of data storage, yet the lack of real observational data and the chaotic nature of Earth's climate system have made it difficult to create climate models that accurately predict future outcomes.

A global climate model (GCM) or general circulation model relies on fundamental physical principles, such as the laws of thermodynamics and fluid dynamics, and use mathematical equations to represent the general circulation of the planetary atmosphere and/or ocean. It integrates and simulates physical, chemical, and biological mechanisms that influence global climate, using observational historical data as initial or boundary conditions, and in turn provides historical, present, and future simulations of the behavior of the climate under different forcing scenarios. More specifically, a GCM breaks the globe into a finite number of three-dimensional boxes, and imposes complex mathematical equations in each box to represent the evolution of and interactions among different climate system components. For example, the Navier-Stokes Equations are a set of coupled differential equations that describe how the velocity, pressure, temperature, and density of a moving fluid such as atmospheric gases and ocean currents are related. An atmospheric GCM (AGCM) models atmospheric circulation and land-surface climates using imposed sea surface temperatures; an oceanic GCM (OGCM) models the ocean with fluxes from the atmosphere imposed; an atmosphere-ocean coupled GCM (AOGCM) covers the sub-models as well as coupled interactions among the atmosphere, ocean, land surface, and sea ice.

FIG. 1 is a schematic diagram 100 illustrating grid cells used by an atmosphere-ocean coupled global climate model (AOGCM), and physical processes considered within each grid cell (From the National Oceanic & Atmospheric Administration, Geophysical Fluid Dynamics Laboratory). In this AOGCM, the earth 110 is divided into 3D grids 115 according to latitude, longitude, and height or pressure, and a pull-out image 120 shows different processes that may be modeled within each grid cell to calculate the evolution of the climate system, with interactions among neighboring cells imposed as boundary conditions. Pull-out image 120 illustrates various components that are taken into account by the AOGCM, including the atmospheric component (clouds, aerosols/chemicals, etc.), the land surface component (vegetation, snow cover, surface hydrology etc.), the ocean component (current circulation, heat and carbon transfer, etc.), the sea ice component (solar radiation absorption, air-sea heat and water exchange), and external forcing factors such as human contributions in terms of gas emissions from cars and factories.

It is easy to see that higher spatial and temporal resolutions provide higher accuracy in climate modeling, but complexity of the model and amount of numerical data thus generated would grow exponentially. For example, with 1.25 degrees in latitude and longitude and 20 vertical levels, the total number of variables modeled would be in the millions range, and data generated would be petabytes in size. Such extensive simulations are only feasible at a few climate research institutions and operational agencies.

When applied to climate forecasting, a GCM is initialized with observed or estimated atmosphere, ocean, land, and sea ice states, and run in forward time into the future. Because of the chaotic nature of the climate system, forecast results can be very sensitive to even small perturbations to the initial conditions or model parameters of the system. Any changes in perturbations or external forcing to the system, for example in the form of solar irradiance, or human contributed carbon and aerosol emissions, would require a GCM-based forecast to be run again, and any additional lead-time for the forecast requires at least polynomial increase in the total number of computations needed, while also increasing the amount of forecast uncertainty. Moreover, differences in GCM model design often lead to very different forecasting skills, with some models performing better than others in some specific climate forecasting applications. Models can also perform better at some specific time of the year than at other times of the year. Ensemble modeling such as seasonal predictions through the North American Multi-Model Ensemble (NMME) has been studied to reduce forecast uncertainty by post-processing, ranking, weighting, and averaging climate projections from different GCMs, yet such approaches may require even higher computational power.

Climate Forecasting with Machine Learning

More recently, advanced machine learning algorithms developed in other research fields and application areas have been suggested for climate analysis and climate forecasting, leading to rapid expansion of research in climate informatics. Such data-driven approaches attempt to learn spatial-temporal features from existing observational historical climate data and/or modeled climate data, but like in ensemble modeling, are overwhelmingly focused on using artificial intelligence in post-processing, ranking, and weighting GCM-based climate forecast results to reduce forecast uncertainty.

Furthermore, some machine-learning based climate forecast systems have utilized long short-term memory neural networks or a combination of autoregressive integrated moving average models and artificial neural networks. Such forecasts are trained and validated exclusively on observational historical data, and are thus significantly constrained by the short observational record of climate data, which has only been measured in situ or via satellites on the global scale for the past hundred years or so.

CLIMATEAI Neural Network (NN)-Based Climate Forecasting System

Broadly, embodiments of the present invention relate to climate forecasting, and pertain particularly to methods and systems for climate forecasting using an artificial neural network (ANN) or neural network (NN)-based forecasting model, trained on global climate simulation data from one or more global climate models (GCMs) and fine-tuned using observational historical climate data including reanalysis data.

More specifically, the CLIMATEAI climate forecasting system employs a deep learning network that is capable of extracting spatial-temporal features as well as functional dependencies and correlations among different GCM simulation datasets to predict future climate conditions. Typically in supervised learning, a predictor model such as a neural network is first trained using a first set of labeled training data to determine an optimal set of internal parameters. The capability of the predictor model is then validated on a second validation dataset and tuned accordingly. A third test dataset is then used to evaluate the predictive or forecast skill of the model.

While existing machine learning-based statistical climate forecasting methods both train and validate on observational historical climate data and are thus constrained by the short observational record of climate data, embodiments of the present invention leverage transfer learning techniques to utilize knowledge acquired from physical dynamical GCMs, and to fully exploit the forecasting potential of both simulation and observational data. By training on vast amounts of currently available physical simulation data that have already been generated by different metrological and climate research agencies, then validating on observational historical data including reanalysis data, the CLIMATEAI system achieves forecasting skills comparable to that of operational dynamical models while requiring only a miniscule fraction of the computation power and time.

To enable training on simulated climate data and to maximize training data availability, as disclosed herein, the CLIMATEAI system provides at least two additional novel features. The first is a process to validate the forecasting potential of individual GCMs developed by different agencies under different assumptions, and to generate a multi-model data ensemble by selecting and combining multiple validated and skillful GCMs or GCM datasets. Such selection and combination of GCM datasets are performed in successive stages, possibly with multiple iterations or passes, to minimize computation overheads without significantly compromising accuracy of the end result. The second novel feature of the CLIMATEAI system is its ability to pre-process the multi-model data ensemble to reduce or remove data heterogeneity, and to augment the data ensemble further, reinforcing the underlying hidden functional dependencies among different simulated climate datasets. Other novel features will become apparent from the detailed description of the invention when read in conjunction with the attached drawings.

As mentioned above, a key advantage of the present invention is its minimal computing power requirement when compared with dynamical model-based climate forecasting having similar performances. For example, when predicting the evolution of El Nino Southern Oscillation in the form of the Nino-3.4 index, a typical dynamical model-based forecast system would require several days for a one-year simulation on a supercomputer with thousands of parallel processing cores. Because a full run of the dynamical model is needed for each target forecast, computational cost and time increase at least polynomially with forecast lead-time, exponentially with simulation spatial resolution, and linearly with additional runs for ensemble modeling. By comparison, training CLIMATEAI neural networks typically takes a few hours for a given set of forecasting targets, while the forecasting process itself would only take minutes on a standard GPU. Additionally, the CLIMATEAI system may be trained incrementally when new climate data become available.

In what follows, illustrative embodiments of the CLIMATEAI climate forecasting system and its sub-systems are presented. It would be understood by persons of ordinary skill in the art that the block diagrams, schematics, and flowchart illustrations as presented herein may be implemented in the form of a computer program product, a hardware product, a combination of computer program and hardware product, and/or apparatus, systems, computing devices, and/or the like to execute instructions, operations, process steps as presented. Thus, embodiments of the present invention may be implemented as computer program products comprising articles of manufacture, such as a non-transitory computer-readable storage medium storing program codes, executable instructions, and/or the like. Embodiments of the present disclosure may also be implemented as methods, apparatus, systems, computing devices, computing entities, and/or the like. As such, embodiments of the present disclosure may take the form of an apparatus, system, computing device, computing entity, and/or the like executing instructions stored on a computer-readable storage medium to perform certain steps or operations. Embodiments of the present disclosure may also take the form of an entirely hardware embodiment, an entirely computer program product embodiment, and/or an embodiment that comprises combination of computer program products and hardware performing certain steps or operations.

System Architecture

Figure 2A:
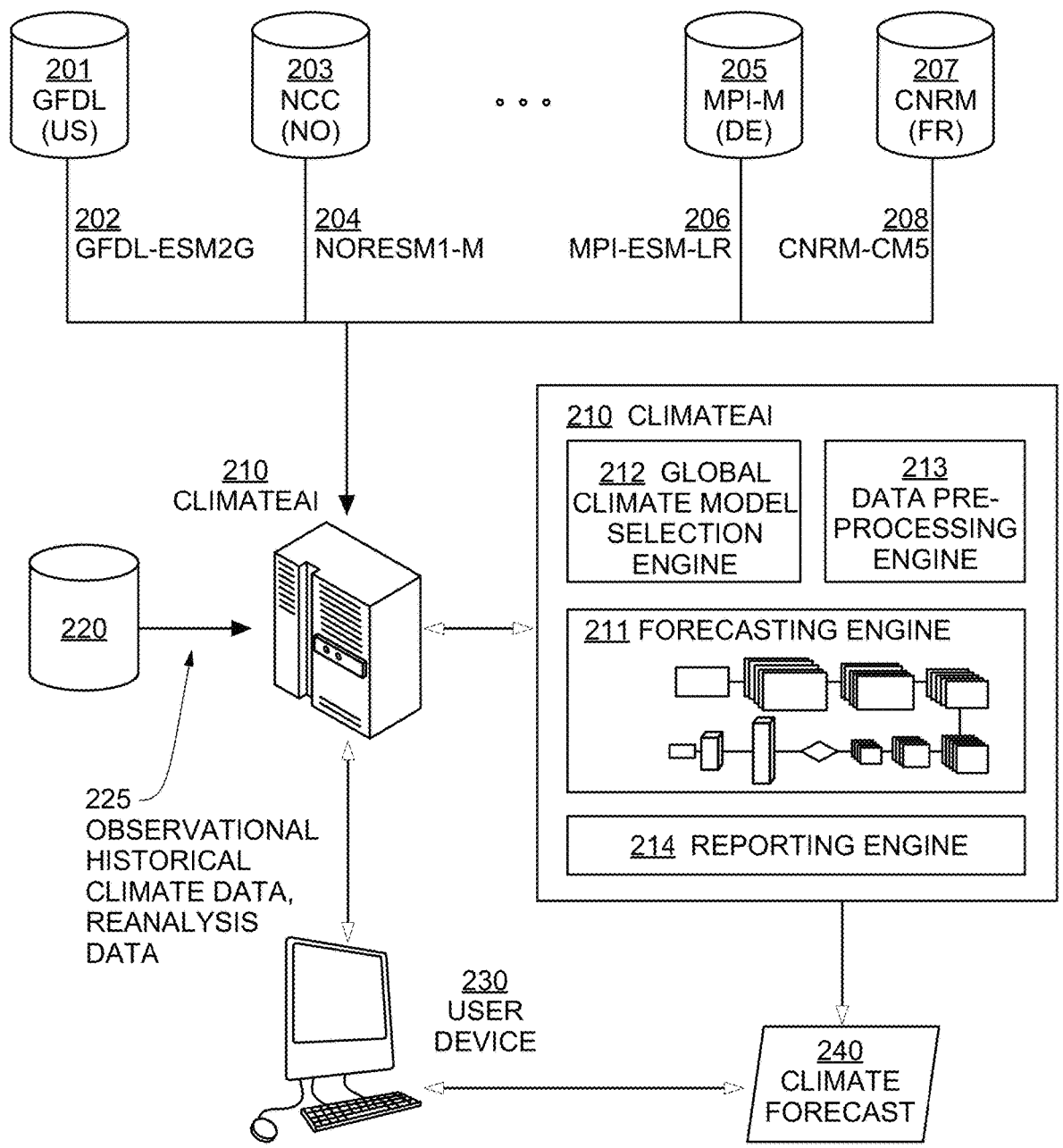
FIG. 2A is an exemplary architecture diagram for an illustrative neural network (NN)-based climate forecasting system, according to some embodiments of the present invention.

FIG. 2A is an exemplary architecture diagram 200 for an illustrative neural network (NN)-based climate forecasting system, according to some embodiments of the present invention. A CLIMATEAI system or sever 210 may be communicatively connected to multiple domestic and international climate research institutions and operational agencies such as the US Geophysical Fluid Dynamics Laboratory (GFDL) 201, the Norwegian Climate Centre (NCC) 203, the German Max Planck Institute for Meteorology (MPI-M) 205, and the French National Centre for Meteorological Research (CNRM) 207. One or more global climate models and corresponding simulation data such as GFDL-ESM2G 202, NorESM1-M 204, MPI-ESM-LR 206, and CNRM-CM5 208 may be retrieved and stored locally at CLIMATEAI server 210.

In this disclosure, the terms global climate model (GCM), general circulation model, and earth system model are interchangeable, and all refer to dynamical models that mathematically represent physical, chemical and biological processes that contribute to the establishment of climate conditions. That is, a GCM is represented by climate variables, parameters, functional relationships among the climate variables and parameters, and initial or boundary conditions. Each GCM may comprise sub-models that are designed independently to represent various interacting atmospheric, oceanic, land surface, or sea ice components. Simulation data from a GCM, GCM simulation data, or GCM datasets refer to the numerical result of climate simulations run according to the GCM, and different simulation datasets may result from the same GCM under different model parameter settings and/or different initial or boundary conditions. For example, a GCM may produce different simulation datasets based on different model inputs, at different spatial and temporal resolutions, for different output periods, and with different bias correction schemes. As a GCM run often requires days or even months of time on a supercomputer with thousands of processors, datasets produced from GCM simulation runs with key parameter settings are conventionally given an official name and published by the climate research institution and operational agencies that design and maintain the GCMs. Furthermore, without loss of generality, in this disclosure a simulation dataset from a GCM may comprise regional climate simulation data. In other words, the term "GCM" in this disclosure covers climate models that are either global or regional.

Another type of dataset published by climate research agencies such as 201, 203, 205, and 207 is climate reanalysis, which combines and assimilates observational historical data with physical dynamical models that simulate one or more components of the Earth system to provide a physically coherent and consistent, synthesized estimate of the climate in the past, while keeping the historical record uninfluenced by artificial factors. For example, instrumental measurements of atmospheric data are scarcer over certain regions of the globe when going back further in time. Climate reanalysis fills in the gaps to deliver a global picture of the state of the atmosphere in the past as close to reality as possible. A reanalysis typically extends over several decades, and reanalysis data often have key uses in monitoring climate variations and changes, initializing and training climate forecasting models, and are increasingly being used in commercial applications such as agriculture and water resource management. In the embodiment shown in FIG. 2A, CLIMATEAI system 210 may retrieve observational historical climate data 225 including reanalysis data from one or more of the climate research institutions and operational agencies, or from an external database 220, for training, fine-tuning, and/or validating and testing an NN-based climate forecasting model.

In various embodiments, CLIMATEAI system 210 may comprise one or more of a neural-network (NN) climate forecasting engine 211, a global climate model selection engine 212, a data pre-processing engine 213, and a reporting engine 214. An "engine" here refers to a logical or physical software and/or hardware module with an encapsulated block of functionality. As will be discussed in detail with references to FIGS. 7-12, the NN-based climate forecasting engine 211 comprises one or more artificial neural networks to capture the spatial, temporal, and functional dependencies among input data, and to project future climate conditions and/or events at a target lead-time.

As would be understood by persons of ordinary skill in machine learning, a neural network needs to be trained and validated on labeled data, and the amount of training data required depends on the complexity of the problem as well as the complexity of the neural network. CLIMATEAI system 210 exploits the forecasting potential of simulated global climate data such as 202, 204, 206, and 208 in the training process. CLIMATEAI system 210 first uses GCM selection engine 212 to validate individual GCMs or GCM simulation datasets and generate a multi-model data ensemble by selecting and combining multiple validated and skillful GCMs. The resulting multi-model data ensemble may be homogenized spatially and temporally by data pre-processing engine 213, and may be augmented artificially to increase the sample count of validated and skillful training data. One or more pre-processed multi-model simulation data ensembles may then be used by forecasting engine 211 to train its underlying neural network, with further fine-tuning and testing on reanalysis data. Once trained, validated, and tested, the NN-based climate forecasting engine 211 may be deployed in a target climate forecasting application, that is, to predict a target output climate variable at a target lead-time, based on values of a target input climate variable. A target "variable" may be a scalar or a vector. Forecasting engine 211 may also perform conventional ensemble modeling techniques to rank, weight, and combine results from multiple forecasting runs to reduce forecast uncertainty. Reporting engine 214 may further post-process, format, and plot climate forecasting results 240, for display on a user device 230.

In some embodiments, user device 230 may be configured to receive user data on forecast inputs and forecast targets, including but not limited to, one or more of a target climate forecasting application, a target output climate variable, a target lead-time, and other input data such as GCM parameter settings and GCM model selection constraints. In some embodiments, the target climate forecasting application is specified by the target output climate variable and target lead-time; in some embodiments, the target climate forecasting application is also specified by an input climate variable to the forecasting process. In some embodiments, a target climate forecasting application may be associated with multiple possible output climate variables. For example, an El Nino Southern Oscillation (ENSO) forecasting application may be configured to predict one of the Southern Oscillation Index (SOI), Equatorial SOI, average sea surface temperature, Nino 3.4 index, and the like, and the exact output climate variable may be determined based on user input, and/or data availability. While shown as a desktop 230, user device 230 may be a user interface on CLIMATEAI system 210, or may be any type of personal or mobile computing entities capable of facilitating interactions with CLIMATEAI system 210. Moreover, in some embodiments, user device 230 may refer to external storage connected to, or internal storage within, CLIMATEAI system 210, where pre-configured climate forecast targets may be stored, and where climate forecasting results may be saved. In other words, "user" here may refer to either a human user or a non-human entity.

Figure 2B:
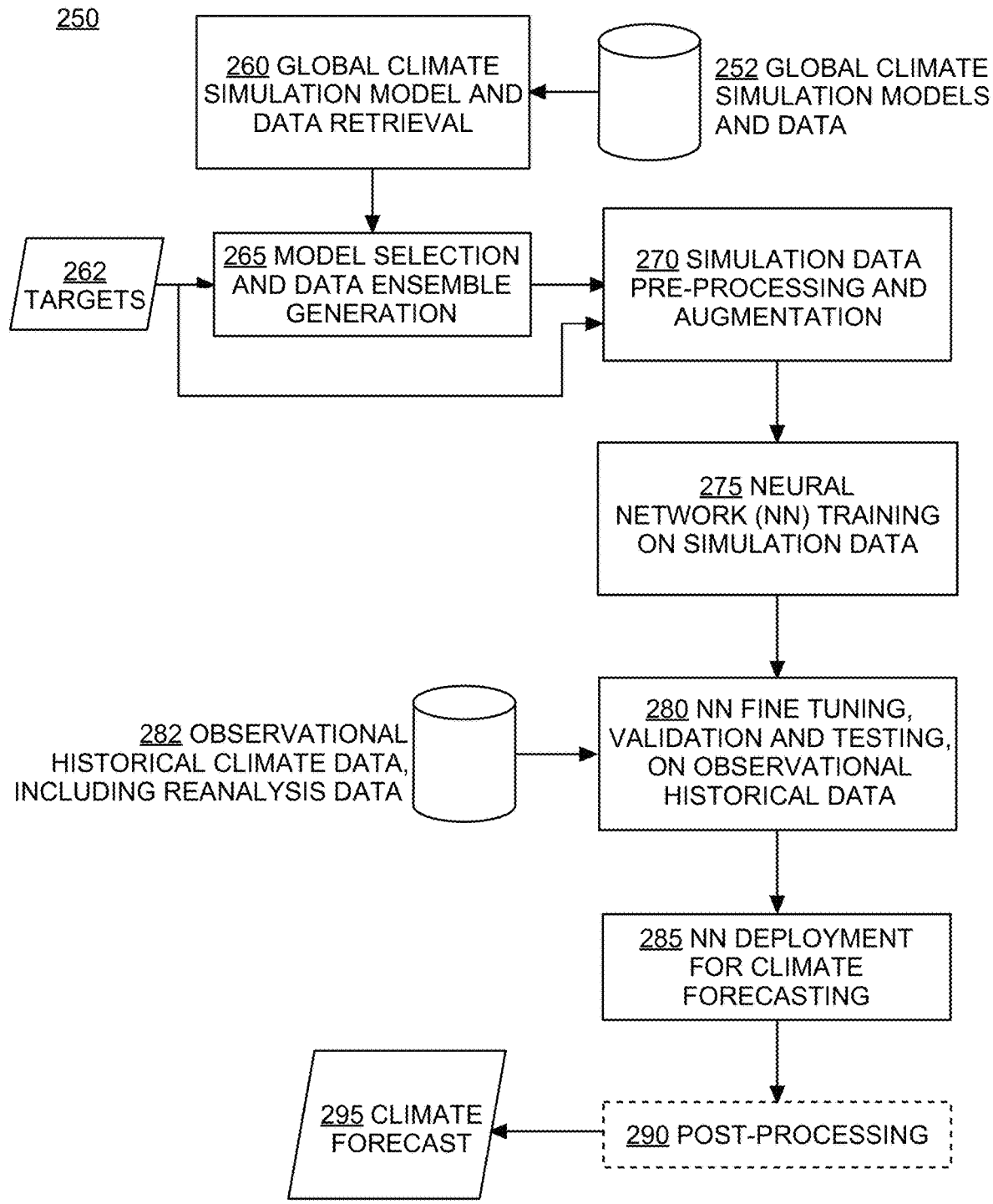
FIG. 2B is an exemplary flow diagram providing a process overview of climate forecasting using the NN-based forecast system shown in FIG. 2A, according to some embodiments of the present invention.

FIG. 2B is an exemplary flow diagram 250 providing an illustrative process overview of climate forecasting using the CLIMATEAI NN-based climate forecasting system 200 shown in FIG. 2A, according to some embodiments of the present invention. First, global climate simulation model and data 252 are retrieved from one or more databases at step 260. Generally, "receive", "receipt," "retrieve," "retrieval," "acquire," or "access" to or of global climate simulation models and data refer to the actions of performing read and/or write operations to model parameters and simulation data in local or remote memory. Model selection and data ensemble generation are performed at step 265, based on forecasting targets 262, including but not limited to, one or more of the target climate forecasting application, target output climate variable, target lead-time for the forecast, and target forecast region. The resulting simulation data ensemble is pre-processed and augmented at step 270 to reduce data heterogeneity, before being used to train the forecasting neural network at step 275. Neural network fine-tuning, validation, and testing occur at step 280, based on observational historical data 282, possibly including reanalysis data. The trained NN-based climate forecasting model may be deployed for climate forecasting at step 285 to generate a climate forecast result 295, and an optional post-processing step 290 may be carried out to weight multiple projections.

Again, one illustrative advantage of the present invention is its minimal computing power requirement when compared with dynamical model-based climate forecasting systems. For example, when forecasting the Nino 3.4 index, a standard GPU is sufficient for training, validating, testing, and forecasting with CLIMATEAI's NN-based forecasting model. It takes O(c) amount of computation for the CLIMATEAI system to forecast n months ahead, where c represents a constant and n is an integer, since the neural network can be trained to forecast directly at the desired lead time. By comparison, a dynamical model-based forecasting system needs to evolve the state of the dynamical models at a pre-determined time step, and can only forecast on a month-by-month basis, thus requiring at least an n-fold increase in the necessary computation time and power. The computational advantages of the CLIMATEAI system increase for longer lead times, for example on the seasonal scale.

Figure 3:
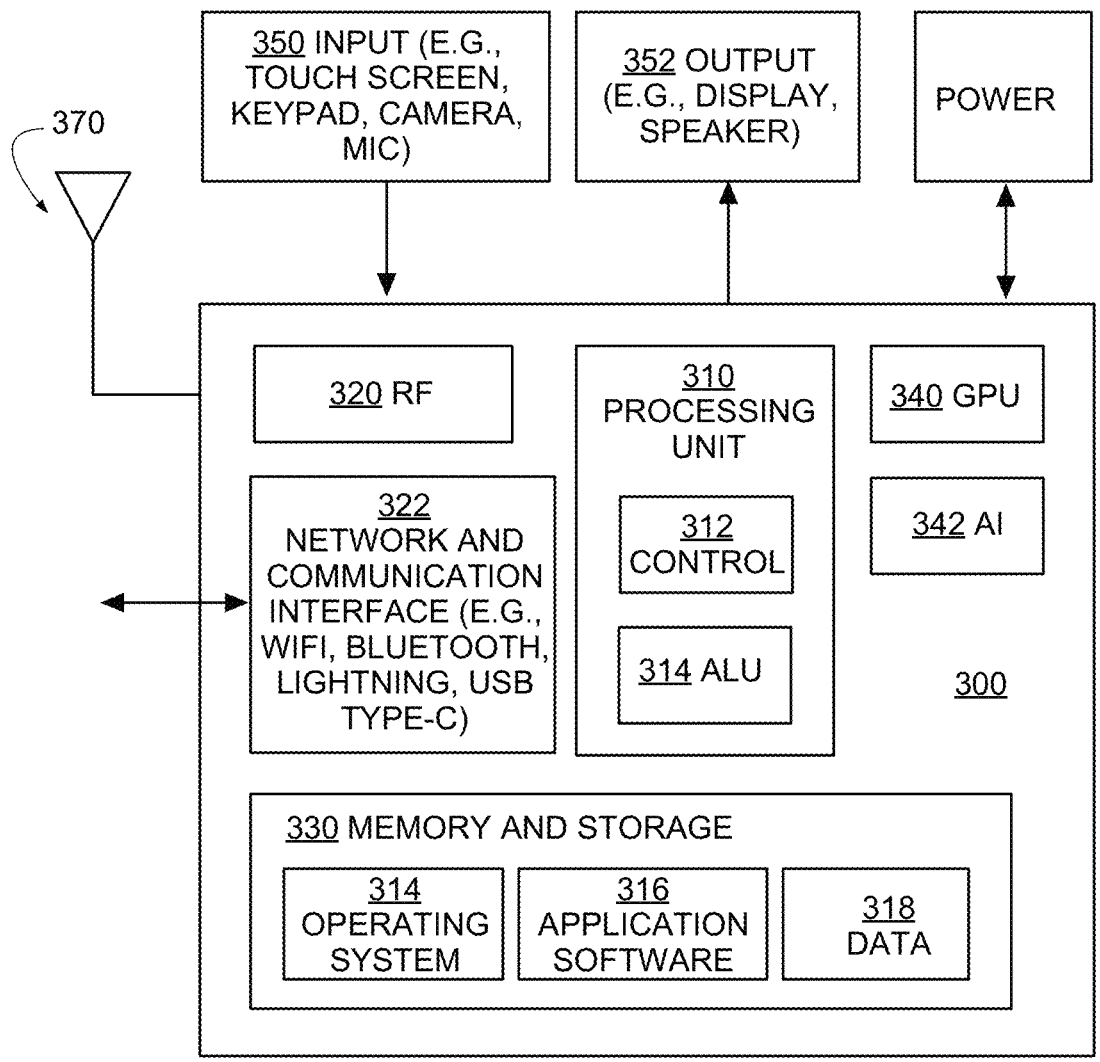
FIG. 3 is an exemplary schematic diagram of a computing entity for implementing a NN-based climate forecast system, according to exemplary embodiments of the present invention.
Figure 4:
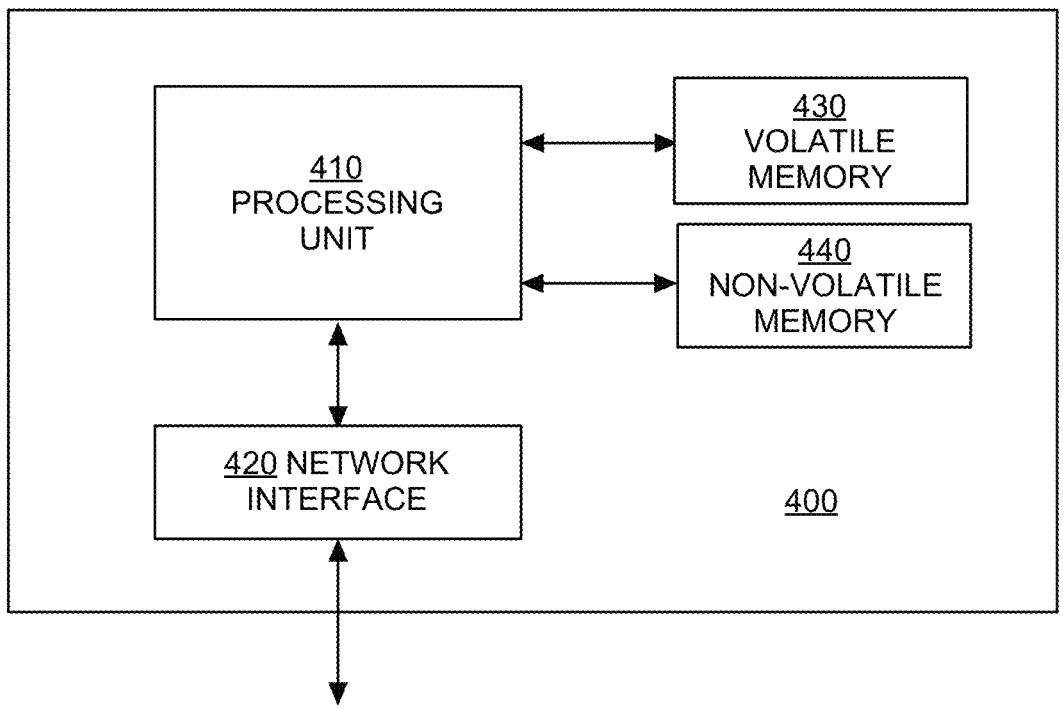
FIG. 4 is an exemplary schematic diagram of a management computing entity for implementing an NN-based climate forecast system, according to exemplary embodiments of the present invention.

In the next subsection, exemplary client computing entities and server management computing entities that may be used to implement different embodiments of the CLIMATEAI system such as shown in FIGS. 2A and 2B are presented. The CLIMATEAI system may include one or more client computing entities 300, connected through one or more networks, to one or more server or management computing entities 400, as illustrated in FIGS. 3 and 4. Each of these components, entities, devices, systems, and similar words used herein interchangeably may be in direct or indirect communication with, for example, one another over the same or different wired or wireless networks. Additionally, while FIGS. 3 and 4 illustrate the various system entities as separate, standalone entities, the various embodiments are not limited to this particular architecture.

Exemplary Client Computing Entity

FIG. 3 is an exemplary schematic diagram 300 of a client computing entity that may be used to implement CLIMATEAI system 210 and/or user device 230 in FIG. 2A, according to exemplary embodiments of the present invention. That is, client computing entity 300 may be used to collect or retrieve forecast targets from a user, for implementing NN-based climate forecasting system 210, for implementing one or more of the modules or engines 211, 212, 213, and 214, and/or for post-processing, storing, and displaying generated climate forecast results. A computing device 300 includes one or more components as shown in FIG. 3. As will be recognized, the architectures discussed and corresponding descriptions are provided in this section for illustrative purposes only and do not limit the scope of the present invention to these embodiments presented.

In general, the terms device, system, computing entity, entity, and/or similar words used herein interchangeably may refer to, for example, one or more computers, computing entities, desktops, mobile phones, tablets, phablets, notebooks, laptops, distributed systems, gaming consoles (e.g., Xbox, Play Station, Wii), watches, glasses, key fobs, radio frequency identification (RFID) tags, earpieces, scanners, cameras, wristbands, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, retrieving, operating on, processing, displaying, storing, determining, creating, generating, generating for display, monitoring, evaluating, comparing, and/or similar terms used herein interchangeably. In various embodiments, these functions, operations, and/or processes can be performed on data, content, information, and/or similar terms used herein interchangeably. Furthermore, in embodiments of the present invention, computing device 300 may be a general-purpose computing device with dedicated graphical processing and artificial intelligence modules. It may alternatively be implemented in the cloud, with logically and/or physically distributed architectures.

As shown in FIG. 3, computing entity 300 may include an antenna 370, a radio transceiver 320, and a processing unit 310 that provides signals to and receives signals from the transceiver. The signals provided to and received from the transceiver may include signaling information in accordance with air interface standards of applicable wireless systems. In this regard, computing entity 300 may be capable of operating with one or more air interface standards, communication protocols, modulation types, and access types. More particularly, computing entity 300 may operate in accordance with any of a number of wireless communication standards and protocols. In some embodiments, user computing entity 200 may operate in accordance with multiple wireless communication standards and protocols, such as 5G, UMTS, FDM, OFDM, TDM, TDMA, E-TDMA, GPRS, extended GPRS, CDMA, CDMA2000, 1xRTT, WCDMA, TD-SCDMA, GSM, LTE, LTE advanced, EDGE, E-UTRAN, EVDO, HSPA, HSDPA, MDM, DMT, Wi-Fi, Wi-Fi Direct, WiMAX, UWB, IR, NFC, ZigBee, Wibree, Bluetooth, and/or the like. Similarly, computing entity 300 may operate in accordance with multiple wired communication standards and protocols, via a network and communication interface 322.

Via these communication standards and protocols, computing entity 300 can communicate with various other computing entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). Computing entity 300 can also download changes, add-ons, and updates, for instance, to its firmware, software (e.g., including executable instructions, applications, program modules), and operating system.

In some implementations, processing unit 310 may be embodied in several different ways. For example, processing unit 310 may be embodied as one or more complex programmable logic devices (CPLDs), microprocessors, multi-core processors, coprocessing entities, application-specific instruction-set processors (ASIPs), microcontrollers, and/or controllers. Further, the processing unit may be embodied as one or more other processing devices or circuitry. The term circuitry may refer to an entirely hardware embodiment or a combination of hardware and computer program products. Thus, processing unit 310 may be embodied as integrated circuits, application specific integrated circuits (ASICs), field programmable gate arrays (FPGAs), programmable logic arrays (PLAs), hardware accelerators, other circuitry, and/or the like. As will therefore be understood, processing unit 310 may be configured for a particular use or configured to execute instructions stored in volatile or non-volatile media or otherwise accessible to the processing unit. As such, whether configured by hardware or computer program products, or by a combination thereof, processing unit 310 may be capable of performing steps or operations according to embodiments of the present invention when configured accordingly.

In some embodiments, processing unit 310 may comprise a control unit 312 and a dedicated arithmetic logic unit 314 (ALU) to perform arithmetic and logic operations. In some embodiments, user computing entity 300 may comprise a graphics processing unit 340 (GPU) for specialized parallel processing tasks, and/or an artificial intelligence (AI) accelerator 342, also specialized for applications including artificial neural networks, and machine learning. In some embodiments, processing unit 310 may be coupled with GPU 340 and/or AI accelerator 342 to distribute and coordinate processing tasks.

In some embodiments, computing entity 300 may include a user interface, comprising an input interface 350 and an output interface 352, each coupled to processing unit 310. User input interface 350 may comprise any of a number of devices or interfaces allowing computing entity 300 to receive data, such as a keypad (hard or soft), a touch display, a mic for voice/speech, and a camera for motion or posture interfaces. User output interface 352 may comprise any of a number of devices or interfaces allowing computing entity 300 to provide information to a user, such as through the touch display, or a speaker for audio outputs. In some embodiments, output interface 352 may connect computing entity 300 to an external loudspeaker or projector, for audio or visual output.

Computing entity 300 may also include volatile and/or non-volatile storage or memory 330, which can be embedded and/or may be removable. A non-volatile memory may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile storage or memory may store an operating system 314, application software 316, data 318, databases, database instances, database management systems, programs, program modules, scripts, source code, object code, byte code, compiled code, interpreted code, machine code, executable instructions, and/or the like to implement the functions of computing entity 300. As indicated, this may include a climate forecasting application that is resident on the entity or accessible through a browser or other interfaces for communicating with a management computing entity and/or various other computing entities.

In some embodiments, computing entity 300 may communicate to external devices like other computing devices and/or access points to receive information such as software or firmware, or to send information from the memory of the computing entity to external systems or devices such as servers, computers, smartphones, and the like.

In some embodiments, two or more computing entities such as 300 may establish connections using a network utilizing any of the networking protocols listed previously. In some embodiments, the computing devices may use a network interface such as 322 to communicate with each other, such as by communicating data, content, information, and/or similar terms used herein interchangeably that can be transmitted, received, operated on, processed, displayed, stored, and/or the like.

In some embodiments, data such as climate forecasting results may be uploaded by one or more computing devices 300 to a server such as 400 shown in FIG. 4 when the device accesses a network connection, such as a wireless access point or hotspot. The data transfer may be performed using protocols like file transfer protocol (FTP), MQ telemetry transport (MQTT), advanced message queuing protocol (AMQP), hypertext transfer protocol (HTTP), and HTTP secure (HTTPS). These protocols may be made secure over transport layer security (TLS) and/or secure sockets layer (SSL).

In some embodiments, dedicated algorithms including artificial intelligence-based machine learning algorithms may be used to perform at least one of the following: (i) compute one or more validation measures for a GCM (ii) evaluate a forecast skill of a GCM simulation dataset, based on a data predictor, a forecast model analog, or a full climate forecast model, (iii) rank and combine simulation data from multiple GCMs into a data ensemble, (iv) homogenize a climate data ensemble by spatial re-gridding and/or temporal normalization, (v) augment a climate data ensemble based on climatology, temporal scaling, and/or statistical resampling, and (vi) train and validate a neural network.

To provide for or aid in the numerous determinations (e.g., determine, ascertain, infer, calculate, predict, prognose, estimate, derive, forecast, detect, compute, or generate) of climate forecasting processes described herein, components described herein may examine the entirety or a subset of data to which it is granted access and can provide for reasoning about or determine states of the system. Determinations may be employed to generate a probability distribution over states of interest, based on a consideration of data. Determinations may also refer to techniques employed for composing higher-level events from one or more datasets.

Such determinations may result in the construction of an optimization, convergence, forecast, or projection from a set of stored observational and/or simulation data. For example, components disclosed herein may employ various prediction and classification schemes and/or systems (e.g., support vector machines, neural networks, expert systems, Bayesian belief networks, fuzzy logic, data fusion engines, etc.) in connection with performing automatic and/or determined action in connection with the claimed subject matter. Thus, schemes and/or systems as disclosed herein may be used to automatically learn and perform a number of functions, actions, and/or determinations.

Exemplary Management Computing Entity

FIG. 4 is an exemplary schematic diagram 400 of a management computing entity for implementing a NN-based climate forecasting system, according to exemplary embodiments of the present invention. The terms computing entity, computer, entity, device, system, and/or similar words used herein interchangeably are explained in detail with reference to client computing entity 300. A management computing entity 400 may be employed to implement components of CLIMATEAI system 210, to perform actions such as NN training, validation, testing, and climate forecasting, possibly on demand via a remote connection. Management computing entity 400 may also aggregate and post-process climate forecasting results from one or more sources, including NN-based climate forecasting systems and/or dynamical model-based forecasting systems.

As indicated, in one embodiment, management computing entity 400 may include one or more network or communications interface 420 for communicating with various computing entities, such as by communicating data, content, information, and/or similar terms used herein interchangeably that can be transmitted, received, operated on, processed, displayed, stored, and/or the like. For instance, management computing entity 400 may communicate with one or more client computing devices such as 300 and/or a variety of other computing entities. Network or communications interface 420 may utilize a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, management computing entity 400 may be configured to communicate via wireless external communication networks using any of a variety of standards and protocols as discussed with reference to client computing device 300.

As shown in FIG. 4, in one embodiment, management computing entity 400 may include or be in communication with one or more processing unit 410 (also referred to as processors, processing circuitry, processing element, and/or similar terms used herein interchangeably) that communicate with other elements within management computing entity 400. Processing unit 410 may be embodied in a number of different ways. For example, as one or more CPLDs, microprocessors, multi-core processors, coprocessing entities, ASIPs, microcontrollers, and/or controllers, in the form of integrated circuits, application specific integrated circuits (ASICs), field programmable gate arrays (FPGAs), programmable logic arrays (PLAs), hardware accelerators, other circuitry, and/or the like. As will therefore be understood, processing unit 410 may be configured for a particular use or configured to execute instructions stored in volatile or non-volatile media 430 and 440. As such, whether configured by hardware or computer program products, or by a combination thereof, processing unit 410 may be capable of performing steps or operations according to embodiments of the present disclosure when configured accordingly.

Although not shown explicitly, management computing entity 400 may include or be in communication with one or more input elements, such as a keyboard, a mouse, a touch screen/display, and/or the like. Management computing entity 400 may also include or be in communication with one or more output elements such as speaker, screen/display, and/or the like.

In various embodiments, one or more of the components of management computing entity 400 may be located remotely from other management computing entity components, such as in a distributed system or in the cloud. Furthermore, one or more of the components may be combined and additional components performing functions described herein may be included in the management computing entity 400.

Artificial Neural Network for Climate Forecasting

As described herein, embodiments of the present invention use one or more artificial intelligence (AI) and machine learning (ML) algorithms or modules to perform weather and climate forecasting, on regional and global scales. Various exemplary ML algorithms are within the scope of the present invention used for performing global climate model selection, data pre-processing and augmentation, and climate forecasting and projection. The following description describes in detail illustrative ML techniques for implementing various embodiments of the present invention.

Neural Network Design: Convolutional Recurrent Neural Networks (CRNN)

Figure 5A:
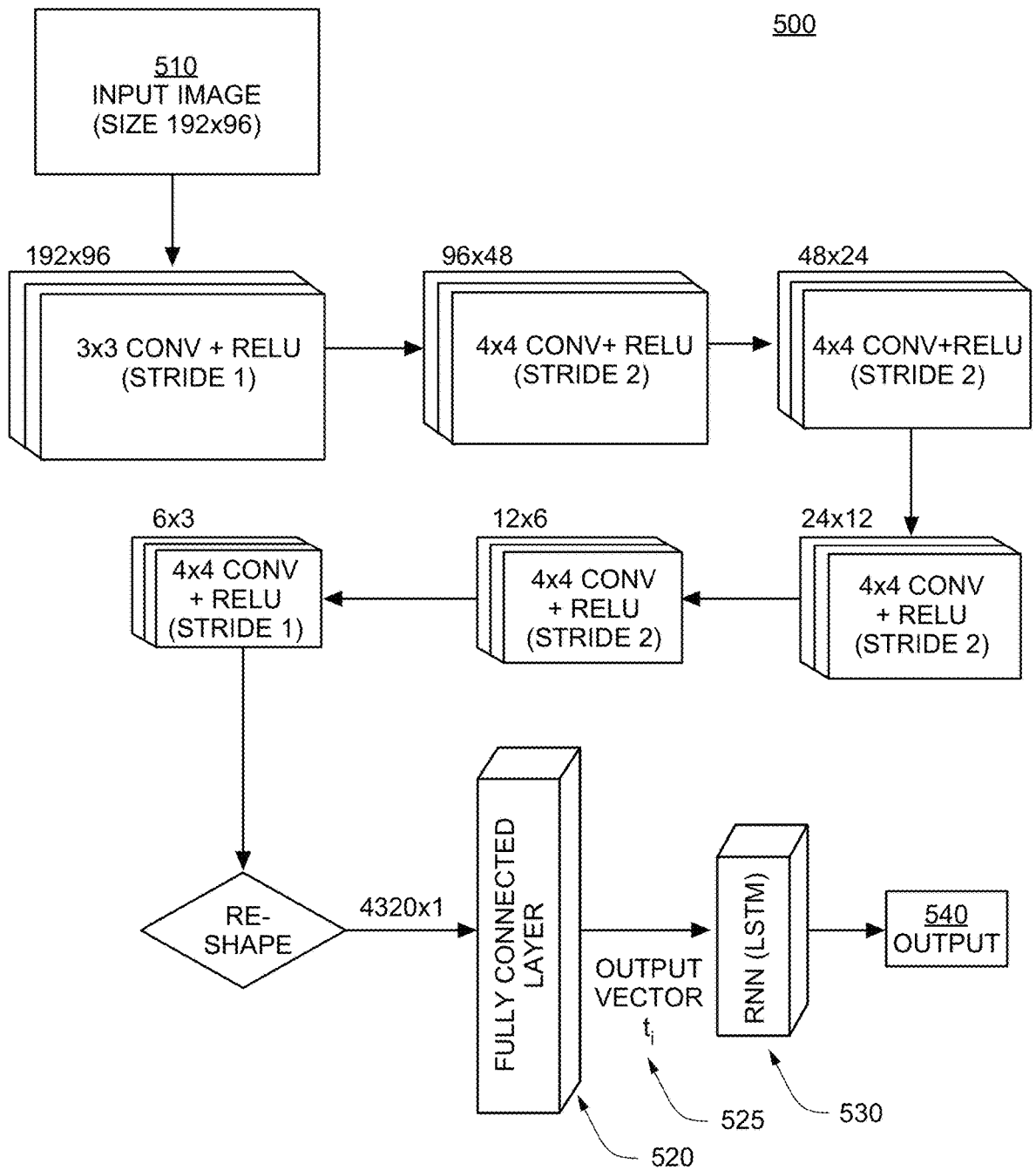
FIG. 5A is an exemplary Convolutional Recurrent Neural Network (CRNN) for climate forecasting, according to some embodiments of the present invention.

FIG. 5A is an exemplary artificial neural network design for climate forecasting, according to some embodiments of the present invention. This exemplary neural network (NN) 500 is for illustration only and does not limit the scope of the invention to the particular NN architecture and particular forecasting application shown. NNs can be viewed as parallel, densely interconnected computational models that adaptively learn through automatic adjustment of system parameters based on training data. Input information are modified based on system parameters when traversing through layers of interconnected neurons or nodes, to activate or trigger particular outputs. The design of an NN refers to the configuration of its architecture and topology, or the specific arrangements of layers and nodes in the network. In some embodiments, the design of the NN may also comprise determination or configuration techniques for pre-training the NN and/or for initialization of hyperparameters and model coefficients.

Figure 5B:
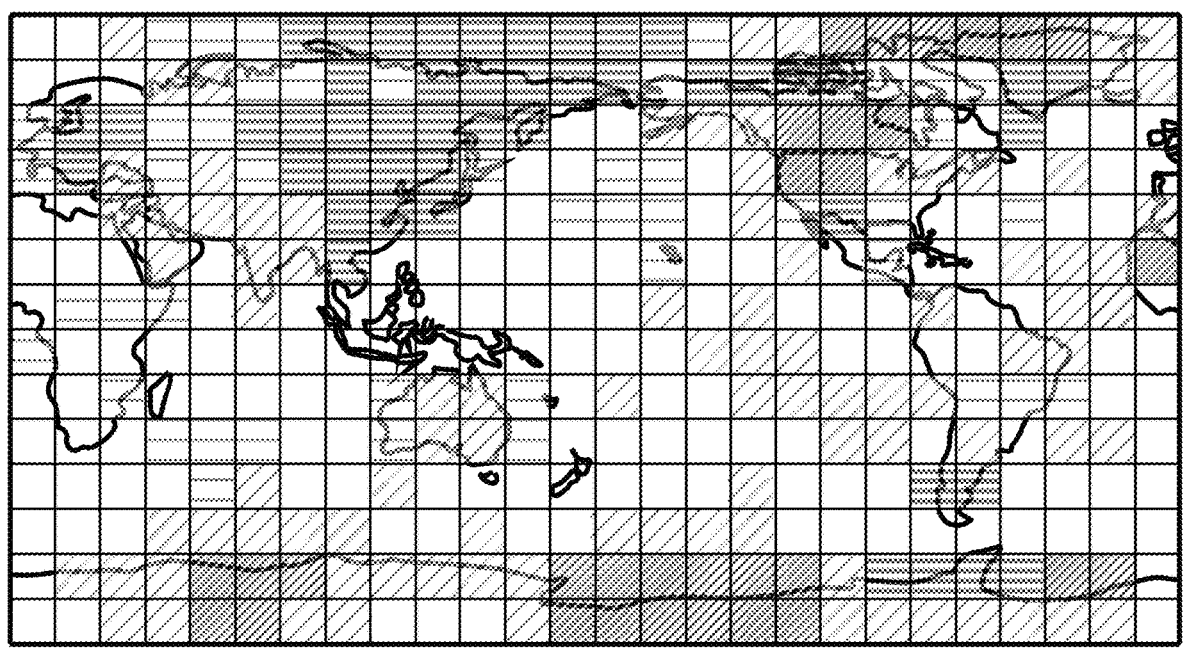
FIG. 5B is a graphical representation of an exemplary data input to the CRNN in FIG. 5A, according to some embodiments of the present invention.
Figure 5B:
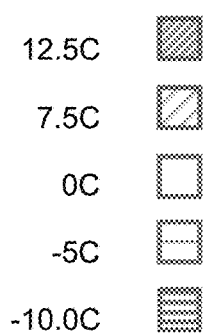

In this illustrative example, NN 500 may be setup to take, as input, a 24-month time series of monthly surface temperatures on a global 192×96 map or grid, and to forecast the Nino-3.4 index at a specified target lead-time such as 6 months into the future. FIG. 5B shows a graphical representation 550 of an exemplary data input, such as input climate data image 510, into NN 500, according to some embodiments of the present invention. In FIG. 5B, land surface and sea surface temperature anomalies on Apr. 1, 1980 are plotted on a two-dimensional grid 550 on the Earth's surface. This two-dimensional grid 550 in FIG. 5B is of size 26×14, much smaller than 192×96, for illustrative purpose only. Size of input image 510 in FIG. 5A is a hyperparameter of NN 500 and may be configured differently in different embodiments of the present invention.

NN 500 is a Convolutional Recurrent Neural Network (CRNN) with a convolutional and recurrent architecture: it encodes the spatial information of each global surface temperature grid using a Convolutional Neural Network (CNN) first, then feeds the encoded information into a Recurrent Neural Network (RNN) having Long Short-Term Memory (LSTM) layers to learn from the temporal sequence. A CNN utilizes the process of convolution to reduce the number of model parameters, and to capture the spatial dependencies in input data. An RNN, on the other hand, has connections that form a directed graph along a temporal sequence, to recognize sequential characteristics and patterns within the input data to predict a future event or scenario.

More specifically, NN 500 first feeds 2-dimensional inputs 510 through multiple convolution (Conv2D) layers with Rectified Linear Units (ReLU), then a fully connected (FC) layer 520. In this illustrative embodiment, the CNN comprises 6 layers with the following network details: [Conv2D⇒batch normalization⇒ReLU]×5⇒[Conv2D⇒ReLU]⇒FC. A convolutional layer applies a convolution or correlation operation by a kernel matrix to the input data to generate a feature map of the input image. ReLU is a non-linear activation function. A fully connected layer has full connections to all activations in the previous layer, and is needed before classification or output activation at an output layer of the NN. Successive convolution-ReLU-pooling stages allow the successive extraction of low-level to high-level features, from local temperature correlations to distant teleconnections. The first convolutional layer in FIG. 5A may use 10 filters, and the number of filters may double in every subsequent convolutional layer. Paddings and strides may be defined to get desired size reductions. Output vector 525 from fully connected layer 520 may feed into an RNN 530 in sequences of successive months, such as 24 months. RNN 530 may have a many-to-one architecture, and may use two LSTM layers, each having 500 hidden units. At the end, the hidden state of the last time step may be decoded to a real value using another fully connected layer, to output predicted monthly Nino-3.4 sea surface temperature anomalies. While the many-to-one architecture may be used in some embodiments, in other embodiments, a many-to-many architecture may also be used in forecasting multiple months simultaneously.

FIG. 5A shows only one illustrative CRNN architecture that is within the scope of the present invention, but the present invention is not limited to the use of CRNNs, or the particular architectural design and hyperparameter settings presented. Other machine learning algorithms and NN designs are also within the scope of the present invention. For example, NN 500 may comprise a Spherical Convolutional Neural Network ($S^2$-CNN) that is invariant or equivariant to 3D rotations and is capable of analyzing spherical images instead of 2D planar images. In some embodiments using an $S^2$-CNN, simulation data pre-processing may first be performed to transform planar data such as 510 and 550 back into a spherical mesh.

Figure 5C:
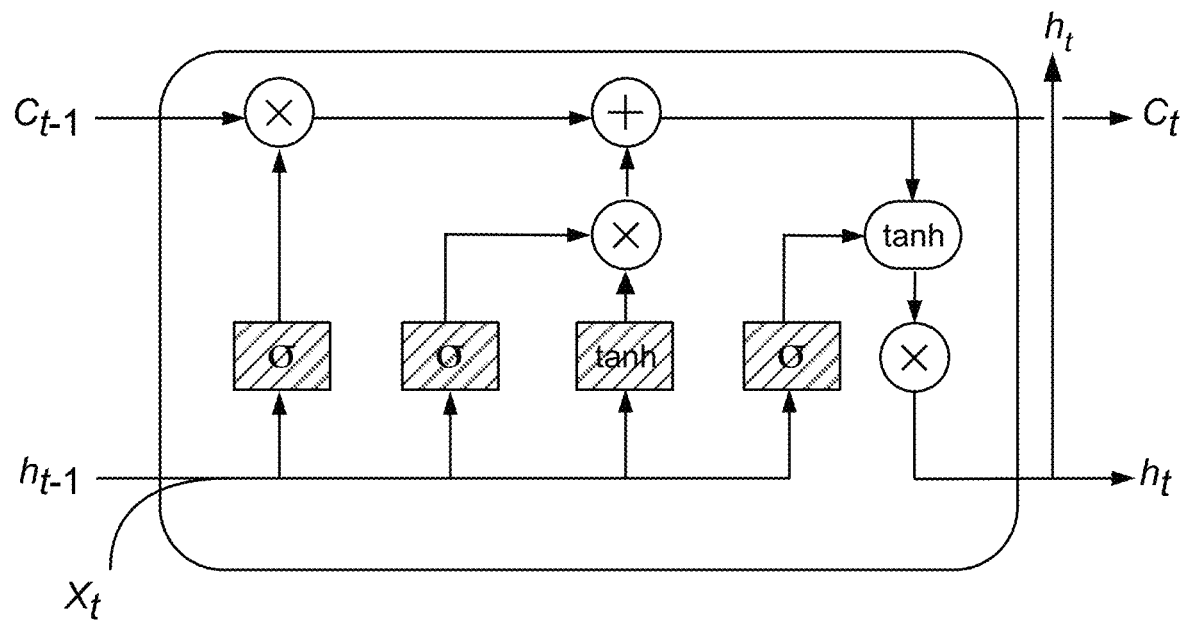
FIG. 5C is an exemplary Long Short-Term Memory (LSRM) cell for use in the CRNN in FIG. 5A.
Figure 5C:
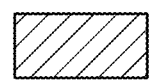
Figure 5C:
Figure 5C:
Figure 5C:

FIG. 5C is an exemplary Long Short-Term Memory (LSTM) cell 580 for use in RNN 530 in FIG. 5A. LSTMs are a special type of RNN capable of learning long-term dependencies in sequence prediction problems. The long-term memory refers to learned weights, and the short-term memory refers to gated cell states.

Training Machine Learning Algorithms

Figure 6A:
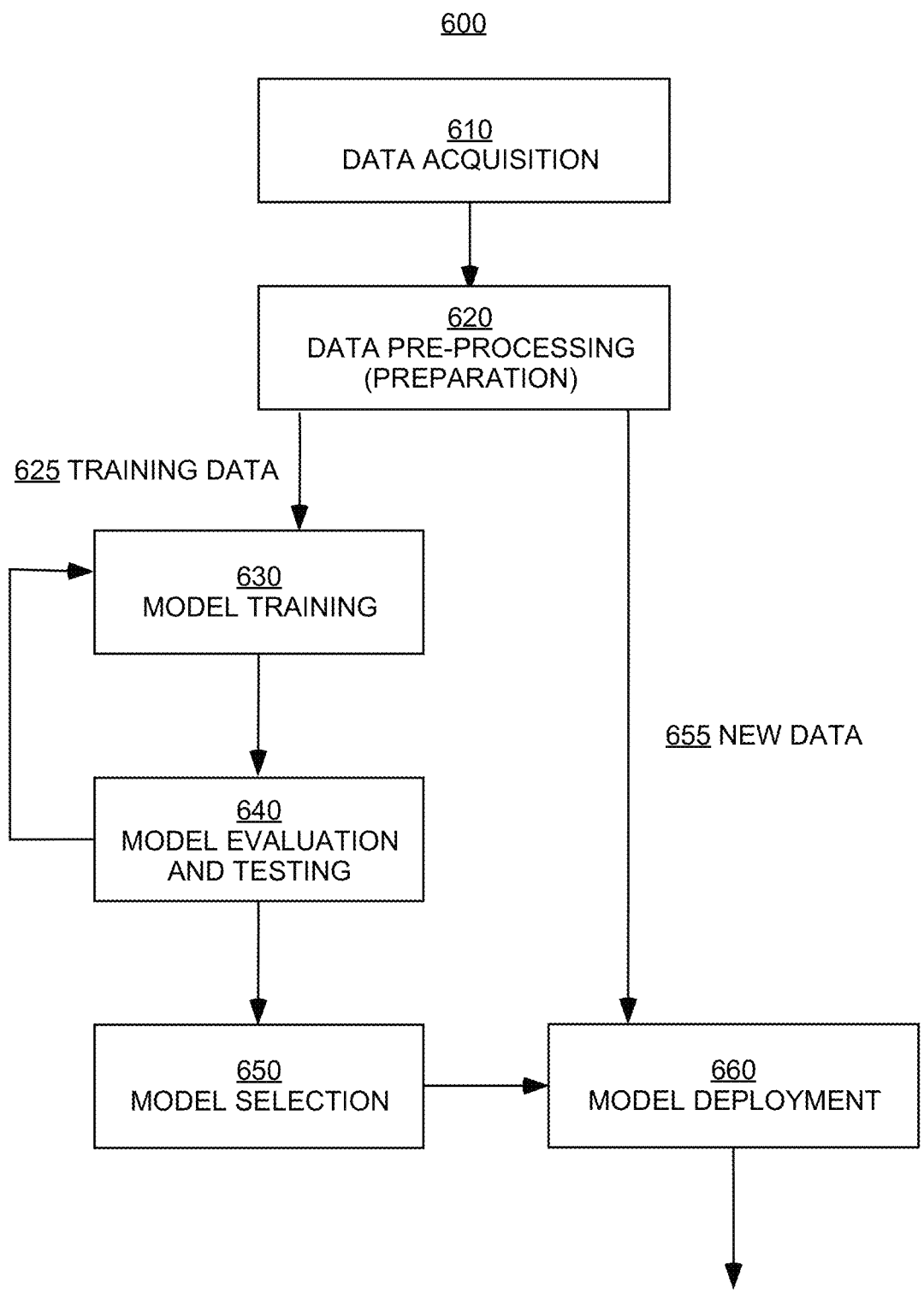
FIG. 6A is an illustrative flow diagram for training a machine learning algorithm, according to exemplary embodiments of the present invention.

FIG. 6A shows an exemplary flow diagram 600 for training a machine learning (ML) algorithm, such as CRNN 500 for climate forecasting, according to exemplary embodiments of the present invention.

The training process begins at step 610 with data acquisition, retrieval, assimilation, or generation. At step 620, acquired data are pre-processed, or prepared. At step 630, the ML model is trained using training data 625. At step 640, the ML model is evaluated, validated, and tested, and further refinements to the ML model are fed back into step 630 for additional training. Once its performance is acceptable, at step 650, optimal model parameters are selected, for deployment at step 660. New data 655 may be used by the deployed model to make predictions.

Training data 625 is a documented dataset containing multiple instances of system inputs (e.g., input climate variables) and correct outcomes (e.g., forecasting results of output climate variables). It trains the ML model to optimize the performance for a specific target task, such as forecasting a specific target output climate variable at a specific target lead-time. In diagram 600, training data 625 may also include subsets for validating and testing the ML model. For an NN-based ML model, the quality of the output may depend on (a) NN architecture design and hyperparameter configurations, (b) NN coefficient or parameter optimization, and (c) quality of the training data set. These components may be refined and optimized using various methods. For example, training data 625 may be expanded via a climate data augmentation process.

Transfer Learning

Generally, ML algorithms assume that training data, validation data, testing data, and new data used during model deployment all have the same statistical distribution and are within the same feature space. For example, in an ideal climate forecasting scenario, training, validation, testing, and forecasting data are all physically coherent and consistent historical observations and measurements. The short observational record of climate data therefore significantly limits the predictive power of typical ML-based forecasting systems.

Figure 6B:
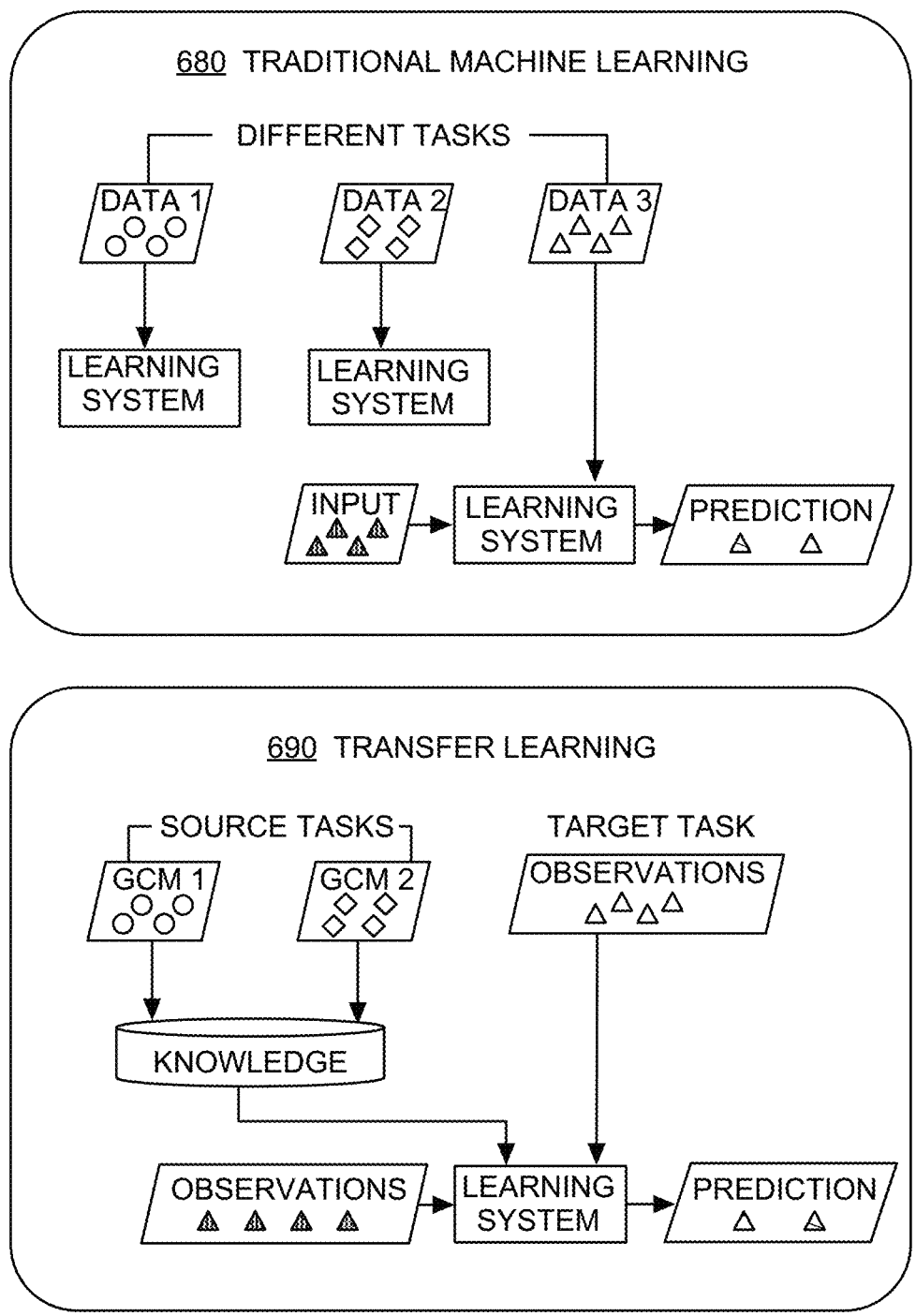
FIG. 6B is an illustrative diagram comparing traditional machine learning to transfer learning in the context of climate forecasting, according to some embodiments of the present invention.

The CLIMATEAI system tackles this limitation on observational historical data availability with novel processes that enable the application of transfer learning techniques. FIG. 6B is an illustrative diagram 670 comparing traditional machine learning to transfer learning in the context of climate forecasting, according to some embodiments of the present invention. Transfer learning is also known as knowledge transfer, multi-task learning, and incremental/cumulative learning. Traditional machine learning techniques 680 try to learn each task separately from dedicated training datasets, while transfer learning 690 tries to transfer the knowledge from some previous source tasks to a target task when the latter has fewer high-quality training data. In the context of climate forecasting, the CLIMATEAI system applies knowledge from GCM simulation data to the task of forecasting future climates. While the concept of using GCM data for training a forecasting model may seem straight forward, it is far from being so, for each available GCM simulation dataset has been generated under different assumptions, with different parameter settings and goals, leading to very different forecasting skills for any one specific target forecasting application. It is a problem of too much data, hundreds of variables, available in multiple time resolutions.

Global Climate Model (GCM) Selection and Multi-Model Data Ensemble Generation

Figure 7:
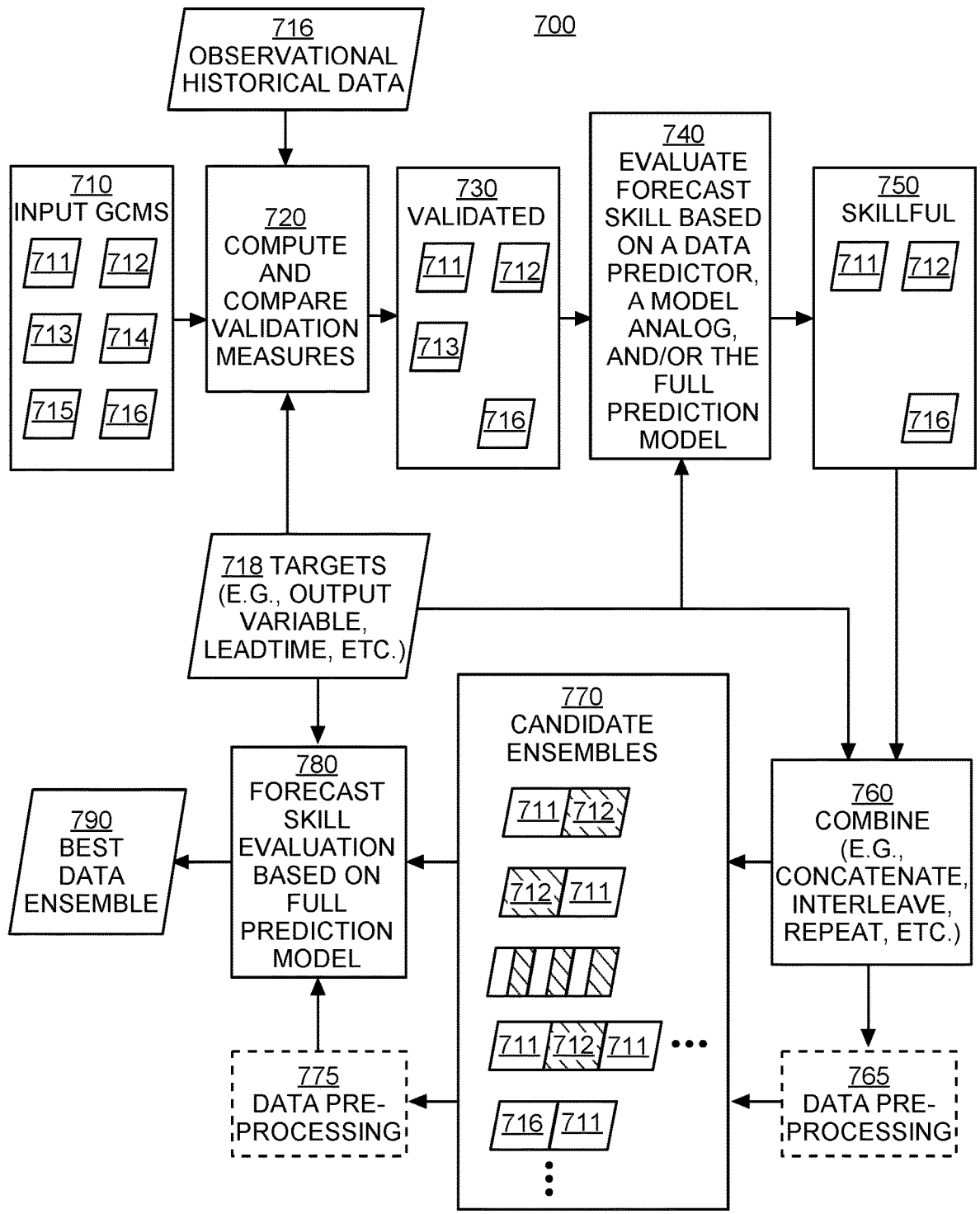
FIG. 7 is an exemplary flow diagram for a process to generate a multi-model ensemble of global climate simulation data, according to some embodiments of the present invention.

As a first step in enabling the use of GCM simulation data in training a NN-network based climate forecasting model, FIG. 7 is an exemplary flow diagram 700 for a process to generate a multi-model ensemble of global climate simulation data, according to some embodiments of the present invention. In this illustrative example, data from different input GCMs 710 are examined for its statistical properties and forecasting skills, and aggregated into a multi-model data ensemble 790.

More specifically, six climate simulation datasets 711, 712, 713, 714, 715, and 716 are first analyzed based on forecast targets 718. For example, simulation datasets CNRM-CMS, MPI-ESM-LR, GISS-E2-H, NorESM1-M, HadGEM2-ES, and GFDL-ESM2G may be used. For simplicity, it is assumed that the six datasets are from six different GCMs here. It would thus be understood that a "GCM" here also refers to the corresponding simulation dataset directly. In some embodiments, some of the datasets 711 to 716 may be from the same GCM, but were generated under different model parameters and/or initial conditions. In addition, only six datasets are drawn in FIG. 7 for illustrative purposes only. In another exemplary embodiment, forty input GCMs or GCM datasets may be used as input to the process, with ten validated via step 720, and six identified as skillful via step 740.

Forecast targets 718 may include, but are not limited to, a scalar or vector target output climate variable to be predicted, a target lead-time at which the target output climate variable is to be predicted, and confidence levels for the forecasting results. Different forecasting applications may be associated with or specified by different forecast targets. Examples of a target output climate variable may include average monthly temperature and precipitation, average daily minimum temperature, seasonal minimum temperature, sea surface temperature, annual maximum wind speed, an index of a climate event such as El Nino Southern Oscillation (ENSO), and the like. A target lead-time may be on a monthly or a yearly scale, such as 3-months ahead, 6-months ahead, or 1-year ahead.

A step 720, a validation measure is computed for each GCM or GCM dataset, for at least one climate variable using observational historical climate data 716. For example, a GCM may be validated around one or more signal statistics of the at least one climate variable, where the validation measure measures the closeness between GCM simulation data statistics and that of observational historical data. In some embodiments, the at least one climate variable may be the target output climate variable as specified by forecasting targets 718 for a specific forecasting application. In some embodiments, the at least one climate variable may be one or more climate variables having direct functional dependencies with the target output climate variable. In yet some embodiments, the at least one climate variable may be an input climate variable to the forecasting system, one or more climate variables having direct functional dependencies with the input climate variable, or any other set of climate variables having some measurable significance on the target forecasting application. In one instance, the at least one climate variable is sea surface temperature for an El Nino region, and the statistics of interest may include bias, variance, correlation, autocorrelation over time, frequency of peaks, and the like. Sea surface temperature may be chosen here based on the target output variable being the Nino-3.4 index.

GCM simulation datasets for which signal statistics match, or is close to the same statistics of the observational historical data may be considered a properly modeled, or validated dataset. In some embodiments, a computed GCM data statistic may be referred to as the validation measure, while a corresponding computed observational historical data statistic may be referred to as the validation threshold. In some embodiments, the validation measure may be a measure of closeness as computed through Mahalanobis distance, Euclidean distance, or any other appropriate distance measure between the GCM simulation data and the observational historical data, between a GCM simulation data statistic and the corresponding observational historical data statistic, or between several GCM simulation data statistics and the corresponding observational historical data statistics. A validated dataset may have a validation measure below a static or dynamic validation threshold. For example, GCMs may be ranked based on their validation measures, and the validation threshold may be chosen so a specific number of GCMs are considered validated. In some embodiments that uses the Mahalanobis distance, climate variables of interest may be transformed into uncorrelated variables first with their variances scaled to 1, prior to calculating the distance measures. In this illustrative example, four GCM datasets 711, 712, 713, and 716 have acceptable validation measures and make up a validated GCM subset 730.

At step 740, validated GCMs or GCM simulation datasets are further evaluated for their ability to forecast the target output climate variable, or for their ability to forecast some climate variables highly correlated with the target output climate variable. In some embodiments, a forecast skill score is computed for each validated GCM based on a forecast function, where the forecast function may be a data predictor function, the NN-based climate forecasting model which will be trained using data ensemble 790, or a model-analog.

The data predictor function may predict the target output variable such as the Nino-3.4 index directly from a GCM dataset, or may predict another closely related climate variable, such as the Nino-3 index and/or the Nino-4 index. This data predictor function may be viewed as a coarse filter to determine whether a given GCM dataset has any forecast power towards the target output climate variable, before more complex filters or metrics are applied.

Evaluating forecasting skills of a GCM using the NN-based climate forecasting model directly may be viewed as a recursive or iterative approach, where each GCM is individually assessed preliminarily, before being augmented further into an ensemble, or before multiple GCMs are combined into an ensemble. The resulting data ensemble may be further assessed for its overall forecasting skills. Here the NN-based climate forecasting model may have been pre-trained, for example on limited amount of reanalysis data, or pre-existing image recognition databases.

By comparison, when a large number of large GCM datasets are used as input 710, model analogs may provide a less computationally intensive alternative to evaluating forecasting skills using the NN-based climate forecasting model directly. A model analog is a simpler forecasting model or a simpler algorithm that is analog to the more complex, NN-based forecasting model, and can generate analog forecasts for evaluating GCM forecasting skills. For example, in one model-analog approach, some initial states of a GCM simulation may be compared to observational historical data related to the target output climate variable, and matching ones may be evolved to generate forecasts that are evaluated for its accuracy.

In meteorology, a forecasting model may be considered "skillful" if it can better predict a target output climate variable than a random guess, a historical average, or an average value computed from GCM data. Forecast skills may be measured by a mean square error (MSE), a correlation between the forecast and the actual values of the target climate variable, or other appropriate error or distance metrics. Such an MSE or correlation value computed for the forecast function discussed above may be viewed as a forecast skill score, and used for selecting a validated and skillful subset of GCMs. Depending on the definition of the forecast skill score, a best-scored GCM may be one with a high forecast skill score, or one with a low forecast skill score. In this illustrative example, three GCM datasets 711, 712, and 716 are chosen as best-scored datasets and make up a validated and skillful GCM subset 750. Again, forecast skill scores may be compared to a threshold; GCM datasets may also be ranked based on their forecast skill scores and a desired number of GCMs may be selected.

In step 760, the best-scored GCM datasets may be combined into candidate data ensembles 770 through different permutation and combination techniques, for another forecast skill evaluation step 780. The goal is to find data ensembles that may improve upon the forecast skill of individual GCMs. In some embodiments, the combining of two or more GCM datasets refers to the merging of these datasets into one training dataset. For example, two validated and skillful GCMs 711 and 712 may be appended to or concatenated with each other (e.g., 711 followed by 712, or 712 followed by 711), interleaved at particular intervals (e.g., alternating between 10-years of data from 711 and 10-years of data from 712), repeated a given number of times (e.g., concatenating 711, 712, 711, etc.), or combined, merged, or joined in any other reasonable way. This combination process may be explicit, where entries from each dataset are copied into a combined or joined dataset. This combination process may alternatively be implicit, where portions of each dataset are fed into the NN-based forecasting model as sequential, parallel, or mixed inputs. As different GCMs may employ different number and/or types of climate variables, coordinate systems, units, spatial scales, temporal scales, biases, and other parameters or hyperparameters, individual GCM datasets or combined GCM datasets may be passed through an optional data pre-processing step 765 before step 770, to clean, homogenize, and/or possibly augment some GCM datasets. Optional data pre-processing step 765 may be implemented using a data pre-processing engine such as 820, and may perform any one or more of the processes shown in FIG. 8.

In step 780, forecast skill may be evaluated by computing an ensemble forecast skill score for each candidate data ensemble, from an ensemble-based data predictor function, the NN-based climate forecasting model, or a model analog, similar to in step 740. The data predictor function in step 780 may be different from the one used in step 740, and so may be the model analog. In some embodiments, a data predictor or a model analog may be used in step 740, while the full NN-based prediction model may be used in step 780, as is the case in FIG. 7. Such successive "filtering" operations allow optimized use of computation power and time. In some embodiments, the generated candidate ensembles 770 are passed through a data pre-processing step 775 before step 780, to clean, homogenize, and/or possibly augment the ensemble datasets before forecast skill evaluation. Optional data pre-processing step 775 may be implemented using a data pre-processing engine such as 820, and may perform any one or more of the processes shown in FIG. 8. In various embodiments, one or more data pre-processing steps such as those shown in FIG. 8 may be performed on any individual GCM dataset, and/or GCM dataset collections, combinations, or ensembles such as 710, 730, 750, 770, and 790, throughout the GCM model selection and ensemble generation process shown in FIG. 7.

Based on ensemble forecast skill scores computed in step 780, a best multi-model ensemble 790 of global climate simulation data may be generated, for use in training the NN-based climate forecasting model for the selected target output climate variable.

In yet some other embodiments of the present invention, a "multi-model" data ensemble may refer to a data ensemble generated by augmenting a single GCM or GCM simulation dataset. That is, given a validated and skillful GCM such as 711, in step 760, data augmentation may be performed to augment GCM 711 using climatology augmentation or McKinnon augmentation techniques according to process 860 in FIG. 8. Such a candidate data ensemble may be evaluated for its forecast skill in step 780 against other candidate data ensembles generated from single GCMs or multiple GCMs. In this disclosure, an augmented dataset generated from a single GCM simulation dataset may also be called a "multi-model ensemble" as it comprises different versions of the original GCM simulation dataset.

Multi-Model GCM Data Pre-Processing

Figure 8:
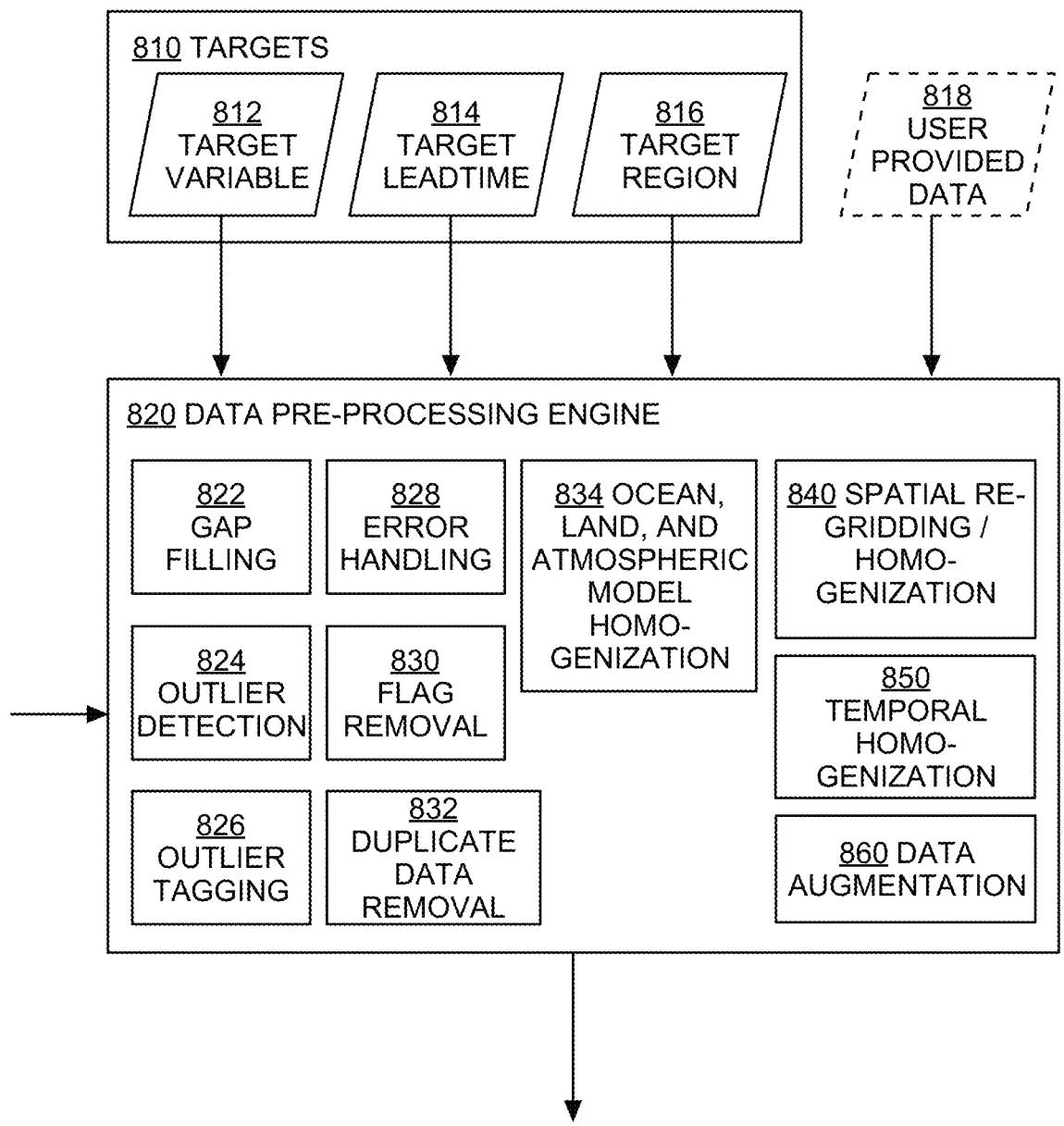
FIG. 8 is an exemplary block diagram for a data pre-processing engine that pre-processes a multi-model ensemble of global climate simulation data, according to some embodiments of the present invention.

FIG. 8 is an exemplary block diagram 800 for pre-processing a multi-model ensemble of global climate simulation data, according to some embodiments of the present invention.

Given a set of forecast targets 810 including, but not limited to, a target output climate variable 812, a target lead-time 814, and a target forecast region 816, data pre-processing engine 820 may perform one or more of the following using one or more sub-modules: gap filling 822, outliner detection 824, outliner tagging 826, error handling 828, flag removal 830, duplicate data seeking and removal 832, ocean, land, and atmospheric model homogenization 834, spatial re-gridding and homogenization 840, temporal homogenization 850, and data augmentation 860. In FIG. 8, each block within data pre-processing engine 820 represents a submodule that is labeled by the process it performs.

During gap filling 822, data pre-processing engine 820 may fill in data gaps within each GCM dataset, spatially or temporally, using interpolation, extrapolation, and data duplication and replacement techniques.

During flag removal 830, data pre-processing engine 820 may first identify unusual data, then remove flags and/or tag the database according to data requirements from a data pipeline of the NN-based forecasting model.

In some embodiments, additional user provided GCM simulation data 818 may also be cleaned and pre-processed for use in a data pipeline of the NN-based climate forecasting model.

For spatial and temporal homogenization 840 and 850, data pre-processing engine 820 may first determine a common spatial scale and a common temporal scale for the multi-model ensemble of global climate simulation data as generated through a process such as 700. The type and design of these common scales may depend on forecasting targets 810.

Spatial re-gridding 840 is the process of transforming, interpolating, or extrapolating from one grid resolution, scale, or coordinate system to another resolution, scale, or coordinate system. Exemplary spatial grids used in climate research include regular, rectilinear, curvilinear, and unstructured. The choice of spatial grids used for a GCM often depend on computational power and efficiency, but also may need to take into account of pole singularities, meridian convergence, and other physical constraints posed when georeferencing locations on a geosphere. Exemplary interpolation methods for spatial re-gridding and homogenization includes bilinear, nearest neighbor, spline, and triangulation, as well as multi-stage techniques that meet certain physical or mathematical constraints.

In some embodiments, spatial re-gridding may be performed iteratively, where the forecast skill of a spatially re-gridded multi-model GCM simulation data ensemble is evaluated, and the common spatial scale modified, updated, or entirely regenerated based on the forecast skill. In some embodiments, such iterative spatial re-gridding may occur subsequent to step 740 or 760 in FIG. 7.

Temporal homogenization 850 is the process of normalizing data from different GCMs onto the same time scale or axis, including the same date system. GCMs from different sources typically use their own individual time scales. For example, a GCM may use a 360-day year or a 365-day year, 30-day months or Gregorian months, may not consider leap years and/or months, and may not use the Gregorian calendar. Time homogenization normalizes data from different GCMs into the same calendar year, and may further remove yearly signals to make all data equivalent on a yearly basis.

Data augmentation, in machine learning, is the process to artificially expand the size of a training dataset by creating modified versions of existing training data, and is commonly used to create variations in training data that improve the performance of the task model. For example, in computer vision where a training dataset comprises colored images of objects, a data augmentation process may employ one or more image processing techniques such as shifting, padding, masking, rotating, flipping, zooming into or out from, sharpening, blurring, brightening, or darkening a given image. Process 860 is tailored specifically for global climate data augmentation. In various embodiments, climate data augmentation process 860 may comprise one or more of statistical augmentation, climatology augmentation, temporal augmentation, and image occlusion, including land/sea masking.

Statistical augmentation broadly refers to generating synthetic but feasible states of climate variables, such as temperature and precipitation, that have the same statistical distributions as real observational climate data or GCM simulation data. One statistical augmentation method is the McKinnon Data Augmentation (MDA) technique, which leverages three climate indices: El Nino-Southern Oscillation (ENSO), Atlantic Multidecadal Oscillation (AMO), and Pacific Decadal Oscillation (PDO). These indices measure the state of the warm and cold temperature cycles in the Equatorial Pacific Ocean, the Atlantic Ocean, and the Northern Pacific Ocean, and affect climate variables such as temperature and precipitation throughout the world. MDA may also extract a global forcing signal (e.g., global warming), and an internal variability signal (e.g., weather). MDA uses linear regression and surrogate time series generation techniques to generate alternate ENSO, AMO and PDO time series with means, variances, and autocorrelations similar to the original time series, and bootstraps all five signals to generate alternate estimates of climate states, which may in turn be used for GCM data augmentation.

In this disclosure, climatology augmentation refers to the generation of synthetic but feasible states of climate variables based on different climatology references, such as different versions of long-term averages. Given an individual GCM dataset or a multi-model GCM data ensemble, the climatology augmentation process may first separate the data signals into long-term signals or trends, global warming signals, seasonal signals, and other signal components caused by similar contributing climate factors. The long-term signal trends may be altered or replaced, within a feasible range to generate augmentation data. Without loss of generality, note that climate variables typically measure the average weather in a given region over a 30-year period; given a GCM dataset or GCM data ensemble, different 30-year averages may be computed or sampled, for example as fifty running averages over a 79-year period. These fifty 30-year averages may be used to calculate fifty different versions of the GCM dataset as climatology-augmented data. That is, temperature anomaly map 550 in FIG. 5B may be re-calculated for fifty different 30-year temperature averages.

Temporal augmentation is the process to remove or duplicate data along the time axis, possibly randomly. For example, a selected set of months may be removed, or duplicated in the GCM data time series, representing a speedup or a slowdown of the underlying physical climate processes.

Image occlusion is the process to crop out or occlude some portions of a 2D climate data image such as temperature anomaly map 550. For example, a random number of randomly located squares of a fixed or random size may be cropped out. The number, size, locations of portions of a climate data image to occlude, and the number of occlusion attempts, are hyperparameters of the image occlusion-based data augmentation process. In some embodiments, land-sea masks may be used for occluding selected portions of the climate data image to focus on land only or on sea only.

Neural Network Training and Validation

Figure 9:
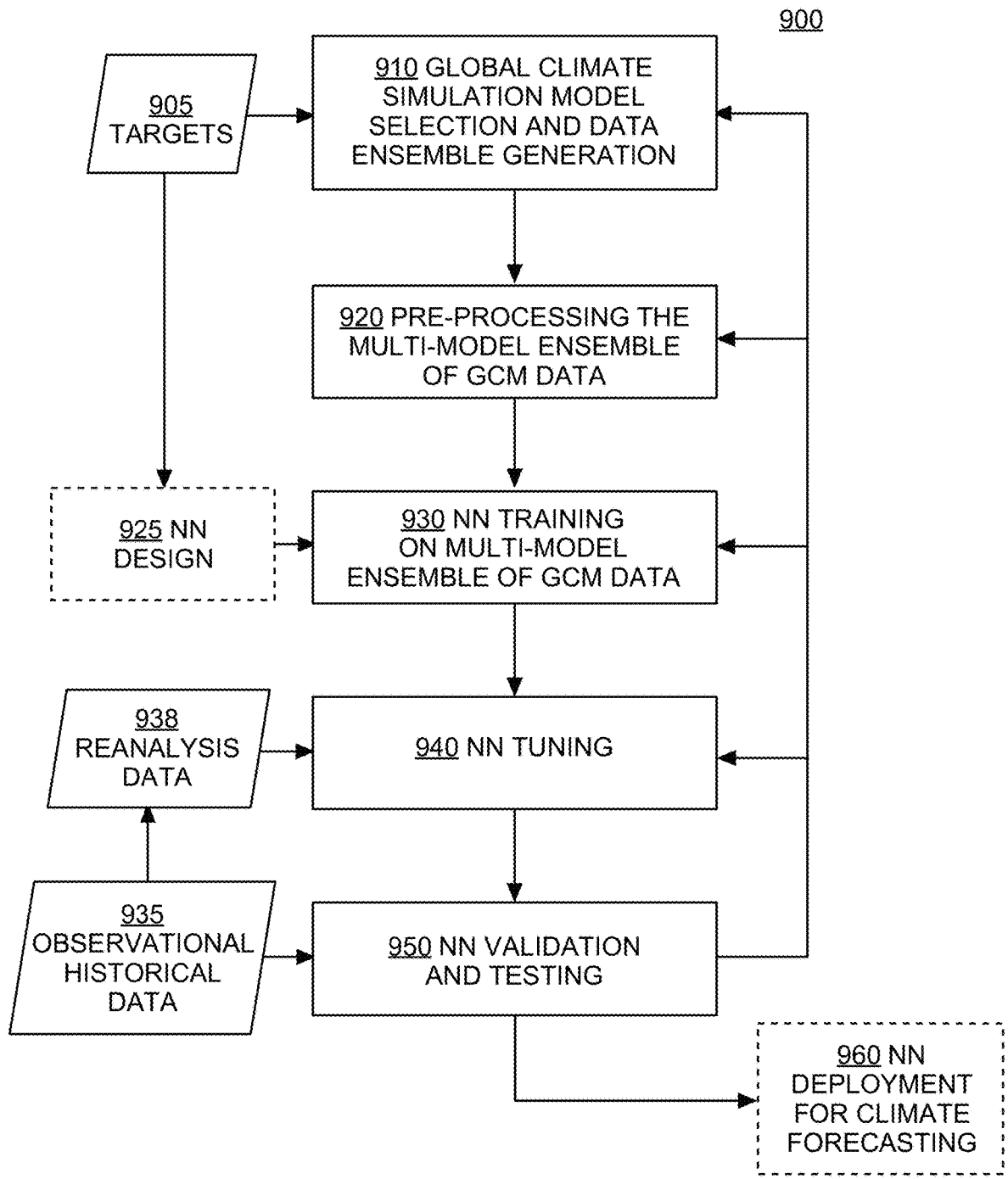
FIG. 9 is an exemplary flow diagram for a process to generate and train a NN-based climate forecasting model, according to some embodiments of the present invention.

Using the multi-model global climate simulation data ensemble generation and pre-processing processes shown in FIGS. 7 and 8, FIG. 9 provides an exemplary flow diagram 900 for a process to generate and train an NN climate forecasting model using the multi-model data ensemble, according to some embodiments of the present invention. The NN climate forecasting model may be further fine-tuned and validated on observational historical data including reanalysis data, before being deployed for actual climate forecasting.

In this illustrative example, forecasting targets 905 are used for global climate simulation model selection and data ensemble generation at step 910, with the data ensemble pre-processed and augmented in step 920. In some embodiments, forecasting targets 905 may be received from a human user through a user computing device such as 230 in FIG. 2A. In some embodiments, forecasting targets 905 may be received from a non-human user, for example as a data file retrieved from a storage medium. As discussed with reference to process 700 in FIG. 7, during GCM selection and data ensemble generation, data predictor functions used for forecast skill score evaluation may be customized based on forecasting targets 905, such as the forecasting application as specified by a target output climate variable and a target lead-time.

In an optional step 925, a neural network such as CRNN 500 in FIG. 5 may be designed, generated, and/or updated, based on forecasting targets 905. That is, hyperparameters of CRNN 500 may be configured in step 925 for different forecasting applications. For example, a loss function for the NN may be chosen. For threshold applications, such as when an El Nino event is to be predicted, cross-entropy loss may be used; for numerical applications, such as when an average temperature is to be predicted, the sigmoid function may be used instead. Furthermore, based on the specific forecasting application as specified by a desired output climate variable, an input variable to the NN may be customized. For example, to predict surface temperature, 2 m air temperature or air temperature at 2 meters above the surface may be used as input; to predict sea surface temperate, air temperature may be used as input. Moreover, depending on the target lead-time, and/or a specific time horizon which is a fixed point of time in the future when the forecast occurs, the structure or architecture of the NN may be customized. For example, to forecast January sea surface temperature at 9-months lead-time, the NN may be customized to forecast month-by-month to predict Januaries 9-months ahead.

Once NN hyperparameters are configured, training of the NN may be performed at step 930 on the pre-processed multi-model ensemble of global climate simulation data. In some embodiments, additional pre-training may occur in between steps 925 and 930 as an initialization of the NN, with all layers of the network unfrozen.

Further fine-tuning of the NN may occur at step 940, based on observational historical data 935 including reanalysis data 938. Recall that climate reanalysis combines and assimilates observational historical data with physical dynamical models to "fill in gaps" and provide a physically coherent and consistent, synthesized estimate of the climate in the past, while keeping the historical record uninfluenced by artificial factors. The availability of reanalysis data is limited by that of the observational historical data, and typical reanalysis datasets span over 40 to 80 years. To maximize the effectiveness of reanalysis data 938 in step 940, in some embodiments, some NN layers may be frozen during tuning, with only a selected subset of NN layers further updated. For example, in CRNN 500 shown in FIG. 5A, the first five convolutional layers and the RNN may be frozen, while the last convolutional layer is fine-tuned on 80 years of reanalysis data.

Once trained, the climate forecasting NN may be validated and tested at step 950, using validation and test sets comprising observational historical data. In some embodiments, all available observational historical data including reanalysis data may be divided by year into a tuning set, a validation set, and/or a testing set, for use in steps 940 and 950. Based on validation results that indicate forecast uncertainty or confidence, any of the steps 910, 920, 930 and 940 may be repeated to update the NN climate forecasting model and improve performance of the forecasting system. The fully trained NN may be deployed in step 960 for actual climate forecasting.

Exemplary Embodiments for NN-Based Climate Forecasting

Figure 10:
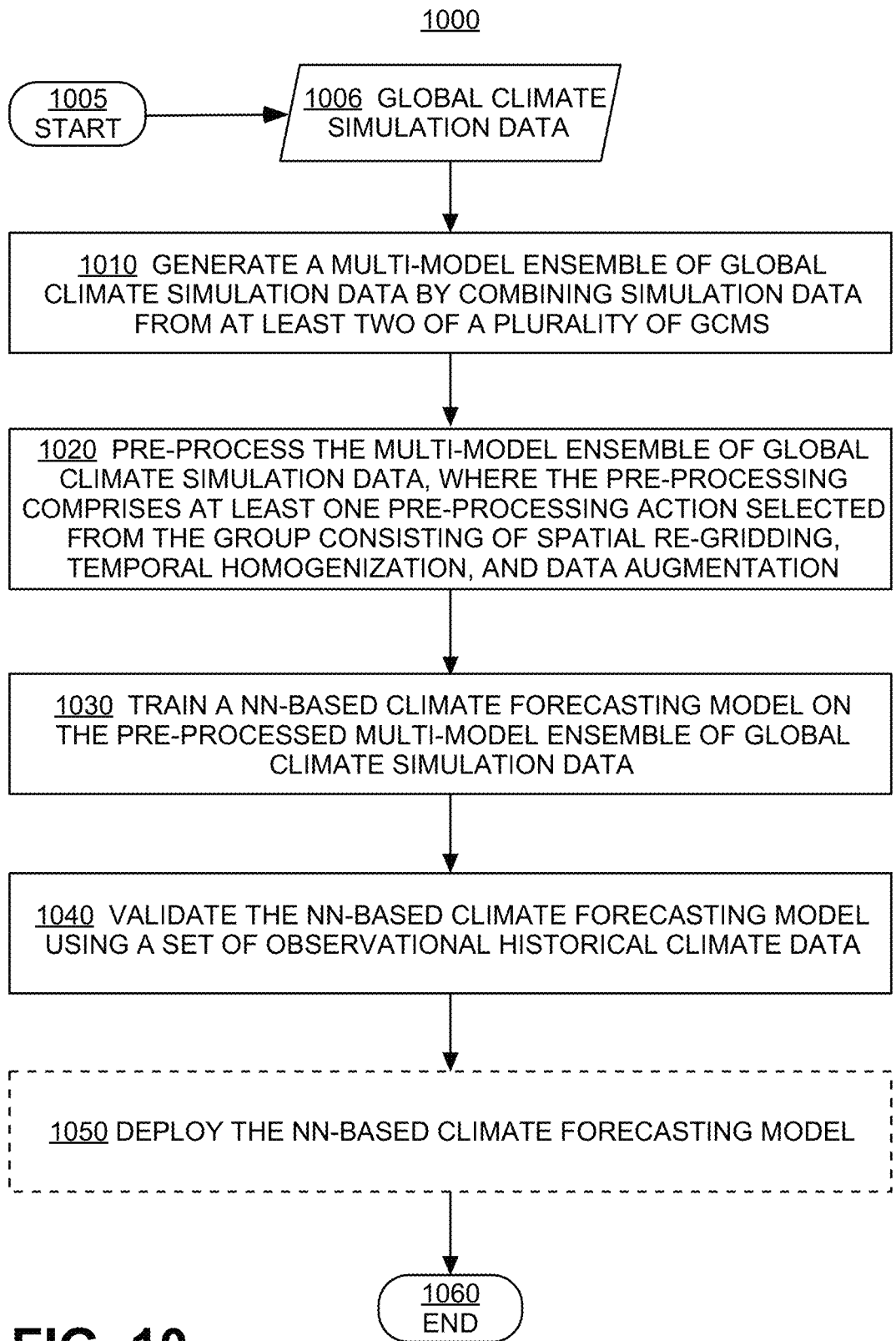
FIG. 10 is another exemplary flow diagram for a process to generate and train a NN-based climate forecasting model, according to some embodiments of the present invention.

FIG. 10 is another exemplary flow diagram 1000 for a process to generate and train an NN-based climate forecasting model, according to some embodiments of the present invention. Upon initialization at step 1005, global climate simulation data 1006 from at least two global climate simulation models are combined at step 1010 into a multi-model ensemble. The multi-model ensemble is then pre-processed at step 1020, where the pre-processing comprises at least one pre-processing action selected from the group consisting of spatial re-gridding, temporal homogenization, and data augmentation. At step 1030, a neural network (NN)-based climate forecasting model is trained on the pre-processed multi-model global climate simulation data ensemble, and validated on a set of observational historical climate data at step 1040. The observational historical climate data may comprise reanalysis data, and the NN's hyperparameters may be fine-tuned during the validation process as well. At an optional step 1050, the NN-based climate forecasting model may be deployed, and the process ends at step 1060.

Figure 11:
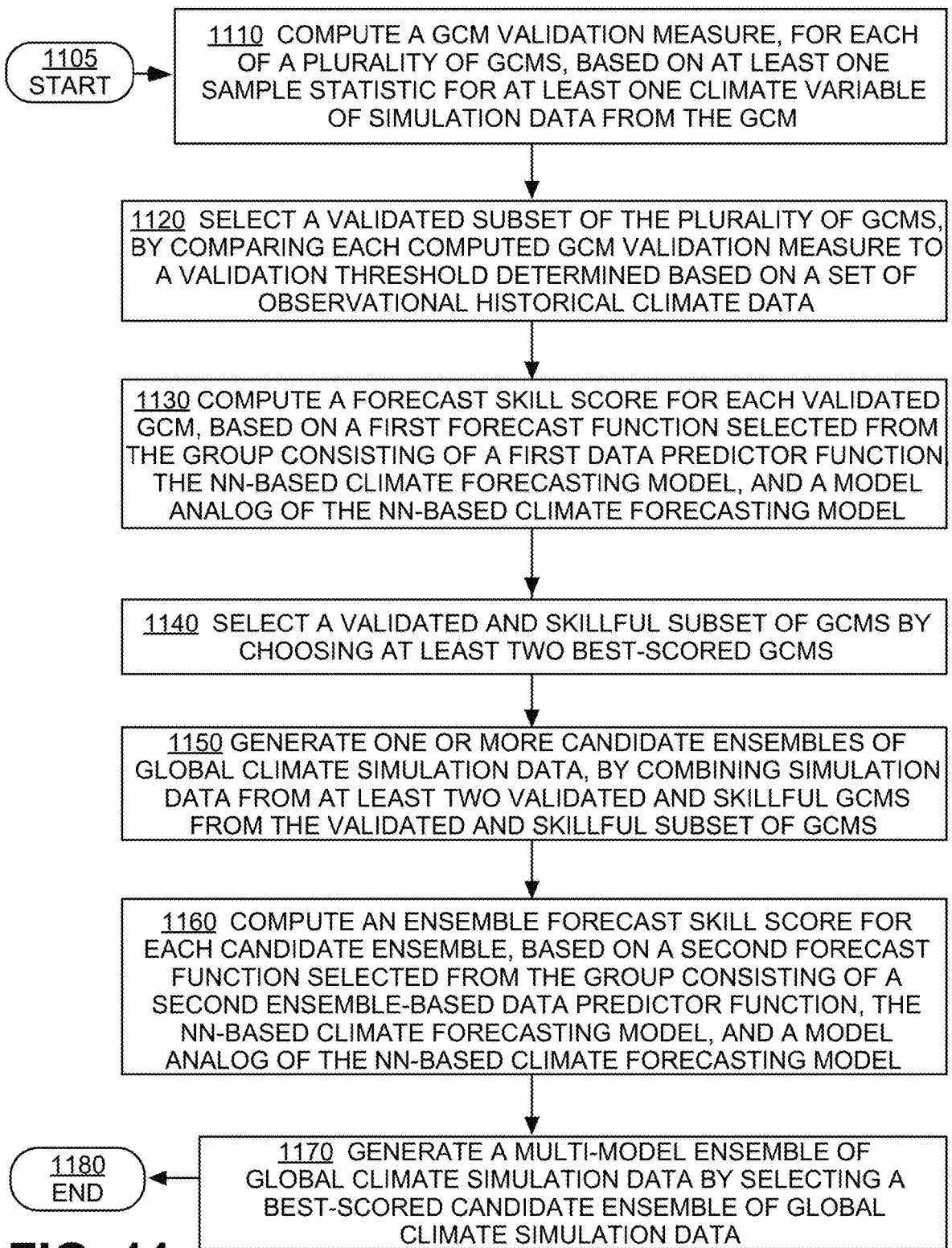
FIG. 11 is another exemplary flow diagram for a process to generate a multi-model ensemble of global climate simulation data, according to some embodiments of the present invention.

FIG. 11 is another exemplary flow diagram 1100 for a process to generate a multi-model ensemble of global climate simulation data, according to some embodiments of the present invention. The process flow shown in diagram 1100 is an exemplary implementation of step 1010 in FIG. 10. Upon initialization at step 1105, a plurality of Global Climate Models (GCMs) are first examined. A GCM validation measure is computed for each of the plurality of GCMs, based on at least one sample statistic for at least one climate variable of simulation data from the GCM 1110. At step 1120, a validated subset of the plurality of GCMs is selected, by comparing each computed GCM validation measure to a validation threshold determined based on a set of observational historical climate data. At step 1130, a forecast skill score is computed for each validated GCM, based on a first forecast function selected from the group consisting of a first data predictor function, the NN-based climate forecasting model, and a model analog of the NN-based climate forecasting model. Next at step 1140, a validated and skillful subset of GCMs is selected by choosing at least two best-scored GCMs. At step 1150, one or more candidate ensembles of global climate simulation data are generated by combining simulation data from at least two validated and skillful GCMs from the validated and skillful subset of GCMs. At step 1160, an ensemble forecast skill score is computed for each candidate ensemble, based on a second forecast function selected from the group consisting of a second ensemble-based data predictor function, the NN-based climate forecasting model, and a model analog of the NN-based climate forecasting model. At step 1170, a multi-model ensemble of global climate simulation data is generated by selecting a best-scored candidate ensemble of global climate simulation data. The overall process terminates at step 1180.

Figure 12:
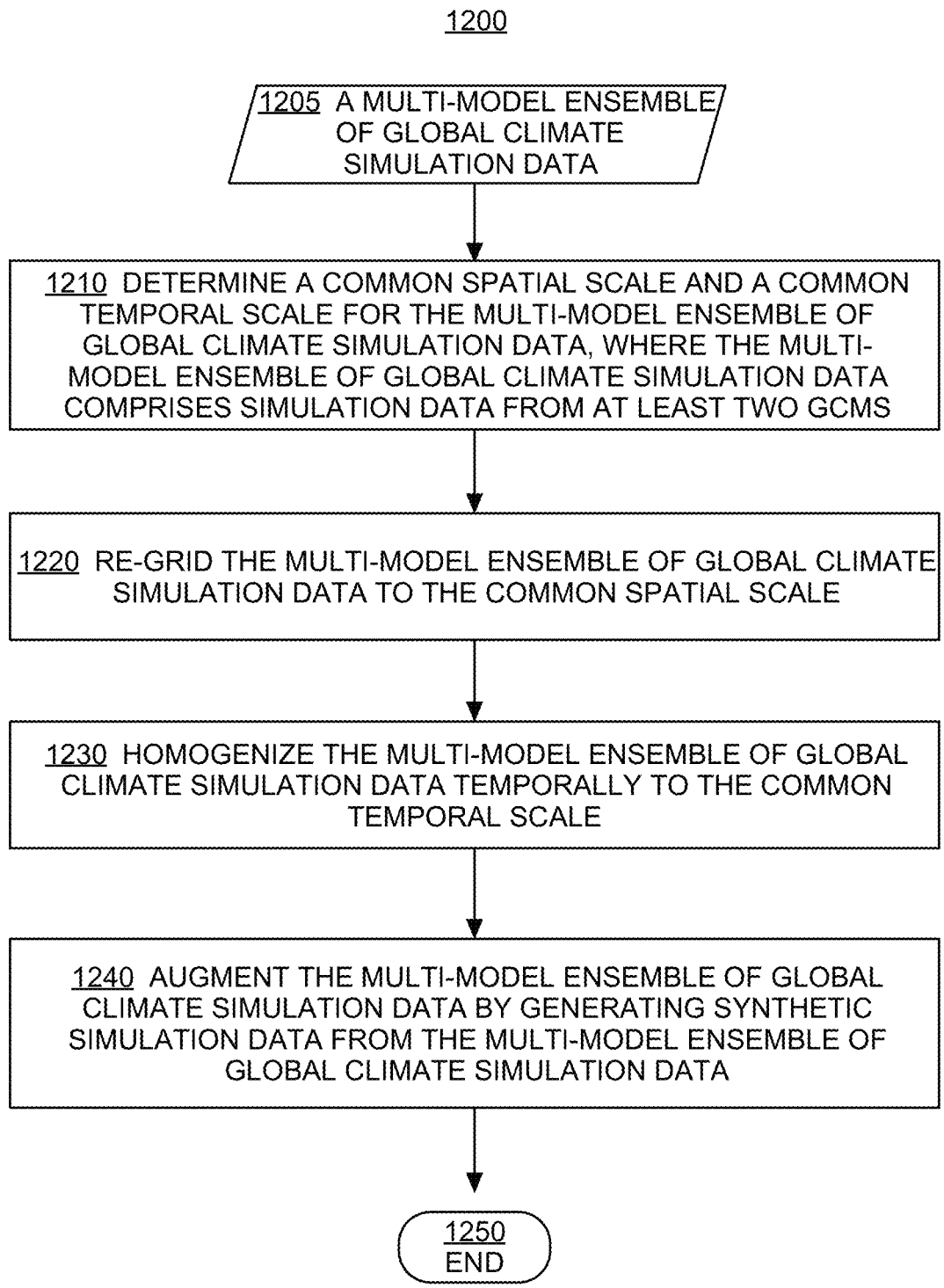
FIG. 12 is an exemplary flow diagram for a process to pre-process a multi-model ensemble of global climate simulation data, according to some embodiments of the present invention.

FIG. 12 is another exemplary flow diagram 1200 for a process to pre-process a multi-model ensemble of global climate simulation data, according to some embodiments of the present invention. The process flow shown in diagram 1200 is an exemplary implementation of step 1020 in FIG. 10. Upon initiation, a multi-model ensemble of global climate simulation data 1205 is examined at step 1210 to determine a common spatial scale and a common temporal scale, where data ensemble 1205 comprises simulation data from at least two GCMs, or two GCM simulation datasets. At step 1220, data ensemble 1205 is re-gridded to the common spatial scale. At step 1230, data ensemble 1205 is homogenized temporally to the common temporal scale. At step 1240, data ensemble 1205 is augmented by generating synthetic simulation data ensemble 1205. In various embodiments, steps 1220, 1230 and 1240 may be performed in any order. The process ends at step 1250.

Exemplary Results for NN-Based El Nino Forecasting

In this section, results from an illustrative example of the NN-based climate forecasting system is provided, where a neural network (NN) is trained to predict monthly Nino-3.4 sea surface temperatures anomalies, which in turn projects the Nino 3.4 Index.

The El Nino-Southern Oscillation (ENSO) is a cycle of warm (El Nino) and cold (La Nina) temperatures in the equatorial Pacific Ocean that influences weather patterns around the world. It impacts North American temperature and precipitation, the Indian Monsoon, and hurricanes in the Atlantic. Thus, it has consequences for agricultural planning, commodity prices, insurance terms, and energy availability.

Traditionally, the European Center for Medium-Range Weather Forecasts (ECMWF) runs a physical dynamical seasonal forecasting model called SEAS5 on supercomputers to forecast the Nino-3.4 index, an index that defines El Nino and La Nina events, and is representative of average equatorial sea surface temperatures (SST) across the tropical Pacific Ocean between 5N-5S and 120-170 W.

According to embodiments of the present invention, the CLIMATEAI system trains a NN 500 as shown in FIG. 5A on simulations from AOGCMs and evaluates the NN on observational historical data, to predict surface temperatures. More specifically, the CLIMATEAI system trains NN 500 on 24-month time series of monthly, preindustrial (piControl) surface temperature data from the following AOGCMs, each named after the modeling centers that produced them: CNRM-CM5 (800 years), MPI-ESM-LR (1000 years), NorESM1-M (500 years), HadGEM2-ES (500 years), and GFDL-ESM2G (500 years). The specific version numbers of the simulation datasets used for training are shown in Table 1. In Table 1, "tos" refers to Sea Surface Temperature, and "tas" refers to Near-Surface Air Temperature.

TABLE 1

List of GCM Simulation Dataset

| Models | Versions |
| --- | --- |
| i. CNRM-CM5 training (~800 years) | 20110701, 20121001 |
| ii. MPI-ESM-LR training (1000 years) | 20120602, 20120625 |
| iii. GISS-E2-H (480 years) | 20170202 |
| iv. NorERM1-M (~500 years) | 20110901 |
| v. HadGEM2-ES (~500 years) | 20110928 (tos), 20110524 (tas) |
| vi GFDL-ESM2G (~500 years) | 20110928 (tos), 20110524 (tas) |

In a first set of experiments, near-surface air temperature (tas) is used as forecast model input, to predict the near-surface air temperature at 3-month lead time (AIR), and skin surface temperature at 3-month lead time (SKT), respectively.

Table 2 shows rankings of different GCM datasets and different ensembles of GCM datasets in predicting AIR and SKT, as measured by Root Mean Square Error (RMSE) when compared to ground truth Nino-3.4 surface temperature targets calculated from the ECMWF ERA5 dataset, which is a gridded dataset of reanalyzed historical observations. In Table 2, "ii+tr(i)" refers to a data ensemble generated by concatenating models ii and i, and "i+tr(ii)" refers to a concatenation of the two models in a reverse order. A concatenation ii+tr(i) of models ii and i is the process of feeding model ii into the NN for training first, followed by model i; a concatenation i+tr(ii) is the process of feeding model i into the NN for training first, followed by model ii. The notation "tr( )" is used to represent a transfer learning process where different models i and ii are both used to train the same NN for a climate forecasting application. In addition, "[ii+tr(i)]×100" refers to repeating "ii+tr(i)" one hundred times as a data augmentation measure. Using such an augmented dataset is equivalent to running or training the forecasting model one hundred times on the same ii+tr(i) data concatenation or ensemble, but each time with different hyperparameters and weight initializations as derived from the previous run. The forecasting model output at the end of the 100 respective runs may also be viewed collectively and probabilistically as a conventional ensemble forecasting distribution.

It can be seen from Table 2 that the multi-model ensemble i+tr(ii) provides best training to predicting AIR, while the multi-model ensemble ii+tr(i) augmented one hundred times provides the best training to predicting SKT.

TABLE 2

| | Predictions at 3-months Lead Time | | | | | | | |
| --- | --- | --- | --- | --- | --- | --- | --- | --- |
| Models | Train RMSE | Valid RMSE | Reanalysis RMSE (AIR) | Reanalysis R2 (AIR) | Reanalysis RMSE (SKT) | Reanalysis R2 (SKT) | Rank (AIR) | Rank (SKT) |
| i | 0.3221611 | 0.41225 | 0.636 | 0.612 | 0.474 | 0.76 | 4 | 3 |
| ii | 0.3162278 | 0.39818 | 0.553 | 0.707 | 0.501 | 0.731 | 2 | 5 |
| iii | 0.3127905 | 0.53467 | 0.825 | 0.347 | 0.683 | 0.501 | 7 | 8 |
| iv | 0.1945483 | 0.42032 | 0.711 | 0.515 | 0.68 | 0.506 | 6 | 7 |
| v | 0.6478366 | 0.56929 | 0.828 | 0.343 | 0.845 | 0.237 | 8 | 9 |
| vi | 0.3495294 | 0.59151 | 0.64 | 0.608 | 0.566 | 0.658 | 5 | 6 |
| ii + tr(i) | 0.3027072 | 0.37141 | 0.573 | 0.685 | 0.439 | 0.794 | 3 | 2 |
| i + tr(ii) | 0.3058446 | 0.37416 | 0.541 | 0.72 | 0.495 | 0.738 | 1 | 4 |
| [ii + tr(i)] × 100 | | | | | 0.422 | 0.818 | | 1 |

In a second set of experiments, data ensembles generated from the same six GCM models i to vi are used in predicting the Nino-3.4 index as the target output climate variable, and again with ground truth computed from ERA5. SEAS5 data from 1993-2016 are used for validation.

Figure 13A:
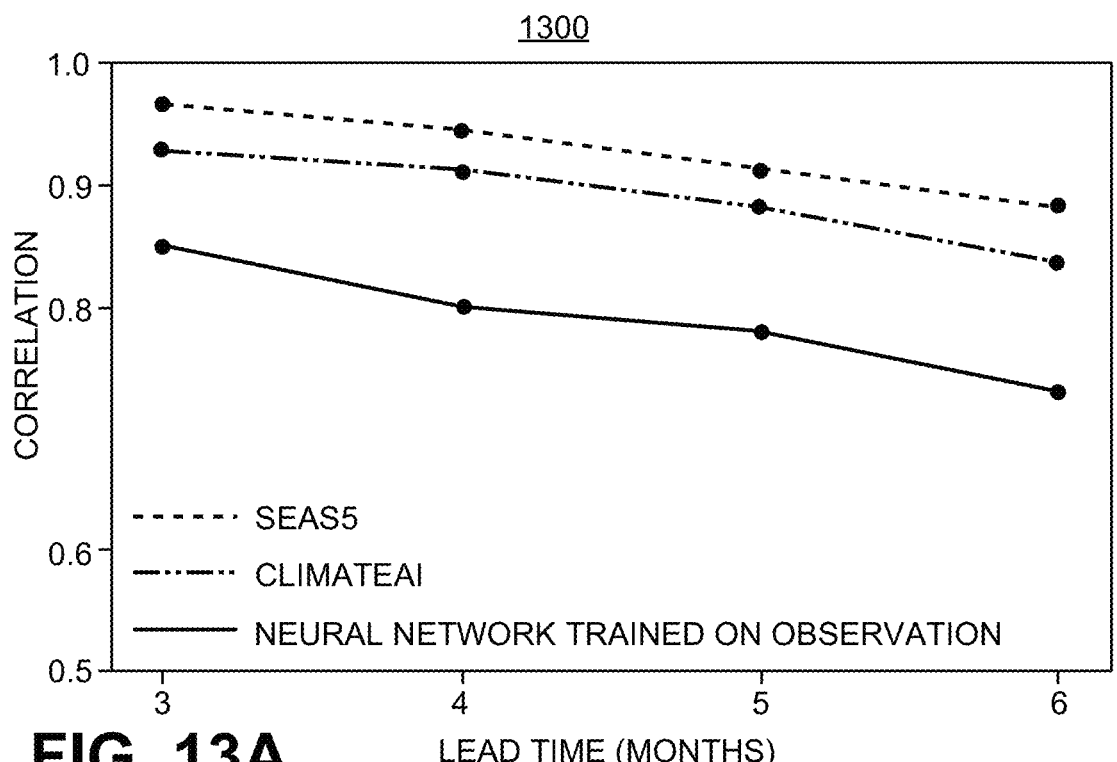
FIG. 13A is a graph comparing correlation measures of different forecast methods in predicting the Nino 3.4 Index at different lead times, according to some embodiments of the present invention.
Figure 13B:
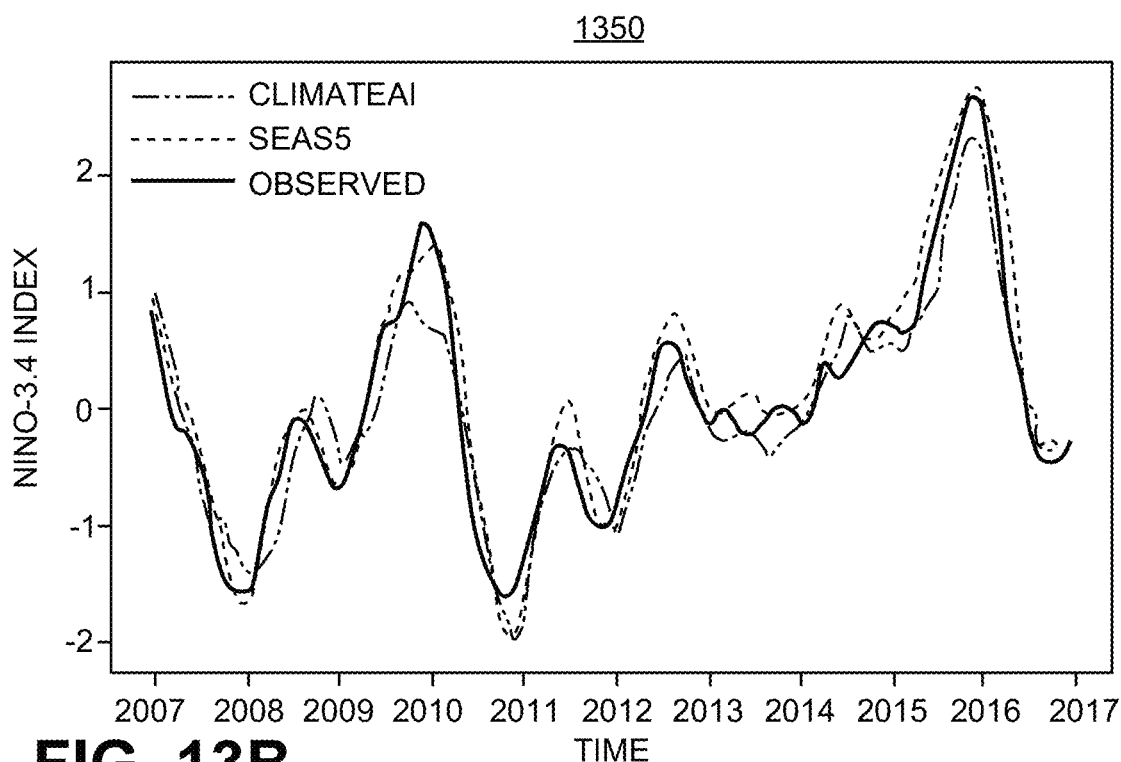
FIG. 13B is a graph comparing the time series of forecast results by different forecast methods in predicting the Nino 3.4 Index, according to some embodiments of the present invention.

FIG. 13A is a graph 1300 comparing correlation measures of different forecasting methods in predicting the Nino 3.4 Index at different lead times, according to some embodiments of the present invention. Meanwhile, FIG. 13B is a graph 1350 comparing the time series of forecast results by different forecasting methods in predicting the Nino 3.4 Index, according to some embodiments of the present invention. The CLIMATEAI forecast result shown in FIGS. 13A and 13B are based on an NN trained on a data ensemble that interleaves simulation data from multiple GCMs. It can be seen that neural networks trained on AOGCMs according to embodiments of the present invention offer comparable forecasting performance to SEAS5 while consuming only a miniscule fraction of the computation power. The CLIMATEAI system that learns from abundant AOGCM simulations also outperforms NNs trained purely on limited amount of historical observations.

In a third set of experiments, the CLIMATEAI system may be trained according to embodiments of the present invention to forecast some primary climate variable such as surface temperature, and an additional shallow neural network may be connected to the NN output to further predict some secondary climate variables such as wind speed, streamflow, growing degree days (GDD), daily temperature, and the like.

Figure 14:
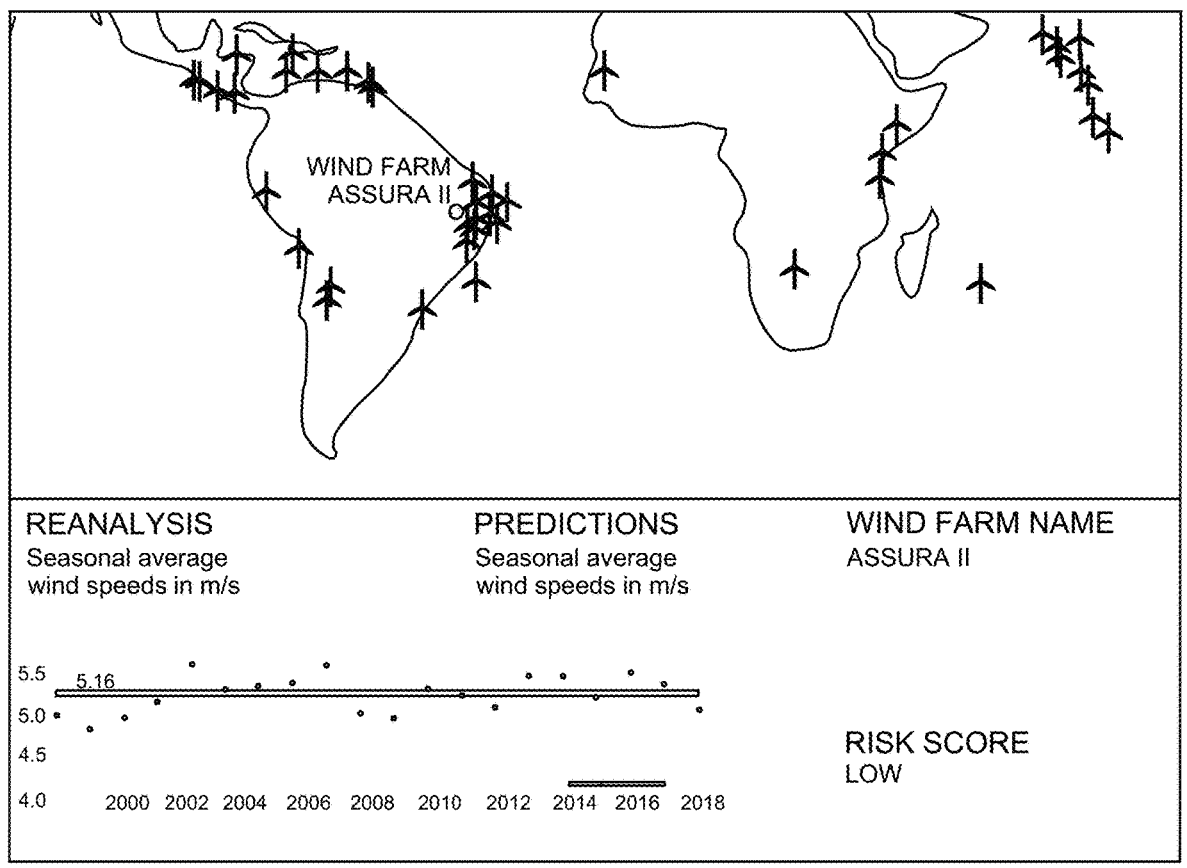
FIG. 14 is an illustrative diagram showing a seasonal average wind speed prediction for a selected wind farm, according to some embodiments of the present invention.
Figure 15:
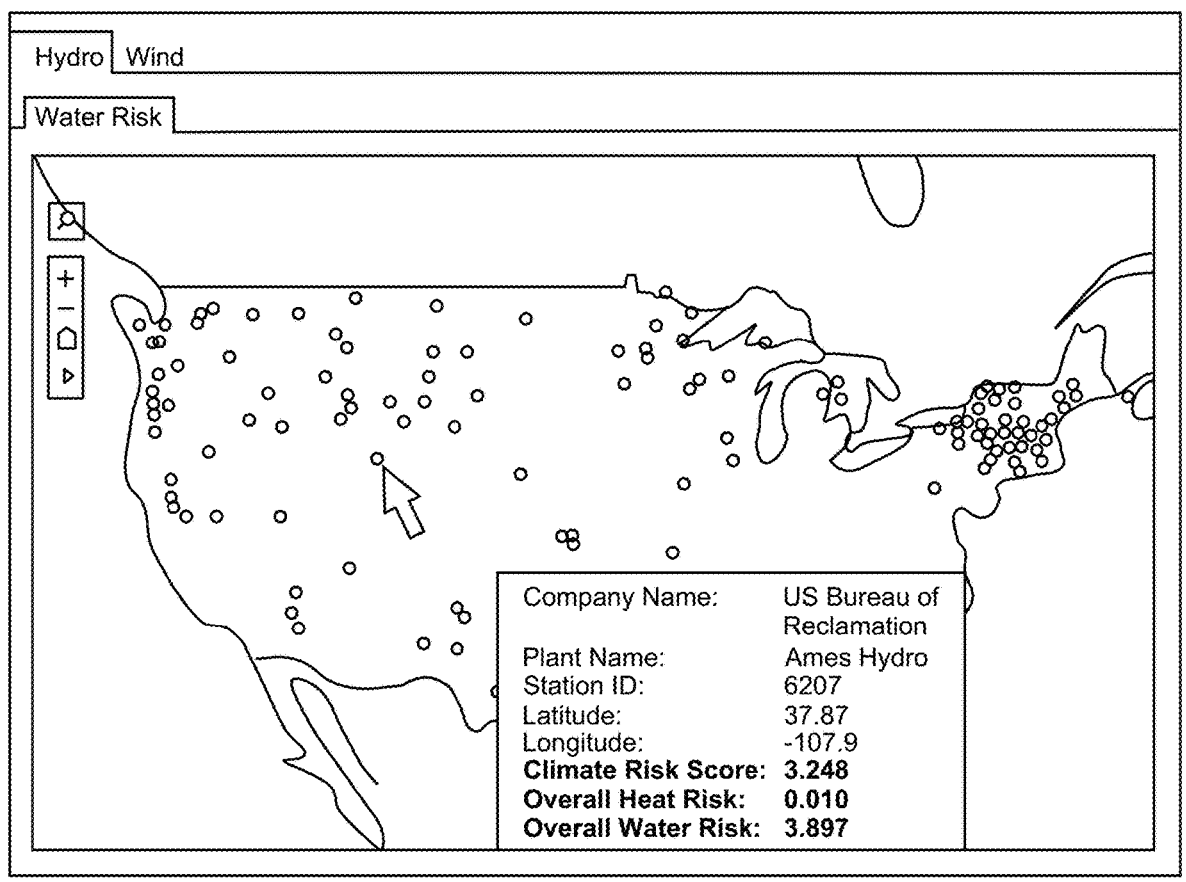
FIG. 15 is an illustrative diagram showing a United States map of hydroelectric plants, and seasonal risk predictions at a selected hydroelectric plant, according to some embodiments of the present invention.
Figure 16:
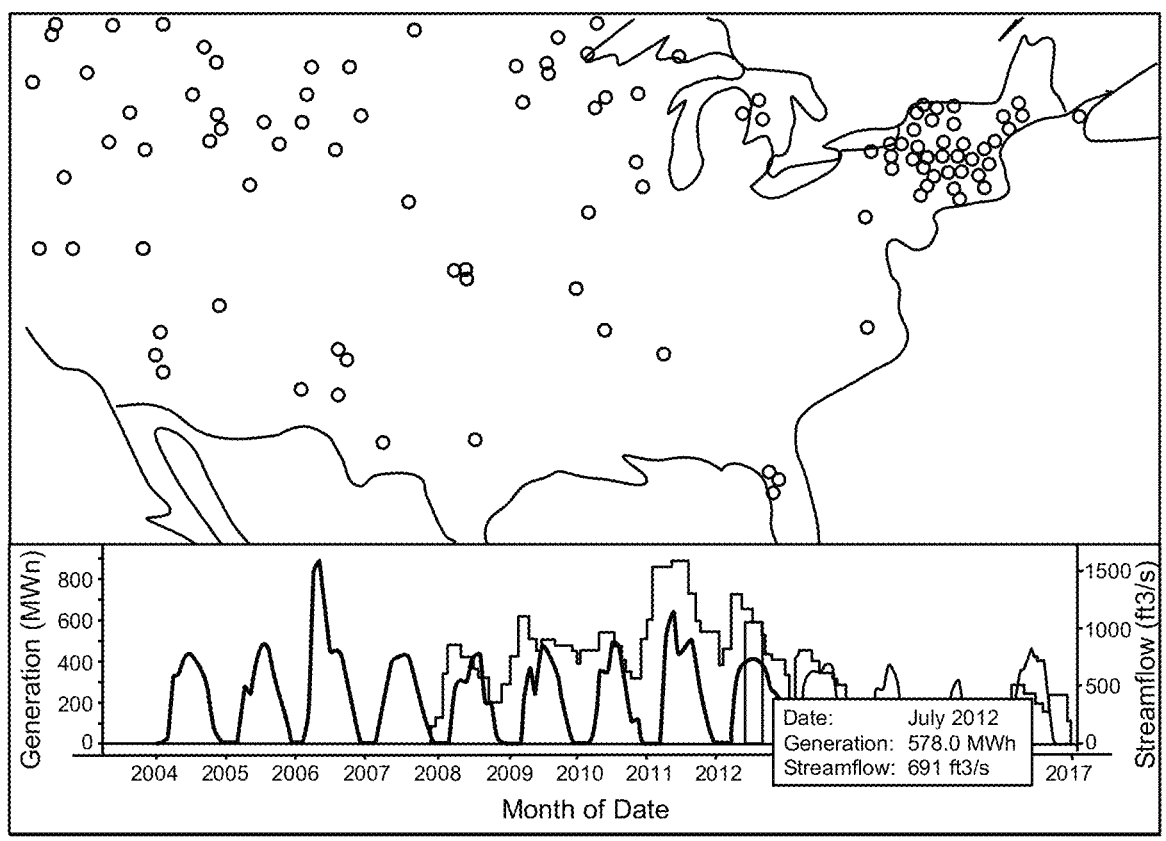
FIG. 16 is an illustrative diagram showing an analysis of power generation by a hydroelectric plant including seasonal variations in power production, according to some embodiments of the present invention.

As illustrative examples, FIG. 14 shows a diagram 1400 of a seasonal average wind speed prediction for the ASSURA II wind farm in Brazil, according to some embodiments of the present invention. FIG. 15 is an illustrative diagram 1500 showing a United States map of hydroelectric plants run by U.S. Bureau of Reclamations, and seasonal risk predictions for the Ames Hydroelectric Plant in Colorado, according to some embodiments of the present invention. Predicted climate risk score, overall water risk and water risk scores are listed. FIG. 16 is an illustrative diagram 1600 showing an analysis of power generation by a hydroelectric plant including seasonal variations in power production, according to some embodiments of the present invention. Total generations and river streamflows are compared in the bottom panel, indicating a high correlation with seasonality in power generation at this site.

CONCLUSIONS

One of ordinary skill in the art knows that the use cases, structures, schematics, and flow diagrams may be performed in other orders or combinations, but the inventive concept of the present invention remains without departing from the broader scope of the invention. Every embodiment may be unique, and methods/steps may be either shortened or lengthened, overlapped with the other activities, postponed, delayed, and continued after a time gap, such that every end-user device is accommodated by the server to practice the methods of the present invention.

The present invention may be implemented in hardware and/or in software. Many components of the system, for example, signal processing modules or network interfaces etc., have not been shown, so as not to obscure the present invention. However, one of ordinary skill in the art would appreciate that the system necessarily includes these components. A computing device, as illustrated in FIG. 3, is a hardware that includes at least one processor coupled to a memory. The processor may represent one or more processors (e.g., microprocessors), and the memory may represent random access memory (RAM) devices comprising a main storage of the hardware, as well as any supplemental levels of memory, e.g., cache memories, non-volatile or back-up memories (e.g., programmable or flash memories), read-only memories, etc. In addition, the memory may be considered to include memory storage physically located elsewhere in the hardware, e.g. any cache memory in the processor, as well as any storage capacity used as a virtual memory, e.g., as stored on a mass storage device.

The hardware of a computing device also typically receives a number of inputs and outputs for communicating information externally. For interface with a user, the hardware may include one or more user input devices (e.g., a keyboard, a mouse, a scanner, a microphone, a camera, etc.) and a display (e.g., a Liquid Crystal Display (LCD) panel). For additional storage, the hardware may also include one or more mass storage devices, e.g., a floppy or other removable disk drive, a hard disk drive, a Direct Access Storage Device (DASD), an optical drive (e.g., a Compact Disk (CD) drive, a Digital Versatile Disk (DVD) drive, etc.) and/or a tape drive, among others. Furthermore, the hardware may include an interface to one or more networks (e.g., a local area network (LAN), a wide area network (WAN), a wireless network, and/or the Internet among others) to permit the communication of information with other computers coupled to the networks. It should be appreciated that the hardware typically includes suitable analog and/or digital interfaces to communicate with each other.

In some embodiments of the present invention, the entire system can be implemented and offered to the end-users and operators over the Internet, in a so-called cloud implementation. No local installation of software or hardware would be needed, and the end-users and operators would be allowed access to the systems of the present invention directly over the Internet, using either a web browser or similar software on a client, which client could be a desktop, laptop, mobile device, and so on. This eliminates any need for custom software installation on the client side and increases the flexibility of delivery of the service (software-as-a-service), and increases user satisfaction and ease of use. Various business models, revenue models, and delivery mechanisms for the present invention are envisioned, and are all to be considered within the scope of the present invention.

The hardware operates under the control of an operating system, and executes various computer software applications, components, program code, libraries, objects, modules, etc. to perform the methods, processes, and techniques described above.

In general, the method executed to implement the embodiments of the invention may be implemented as part of an operating system or a specific application, component, program, object, module or sequence of instructions referred to as "computer program(s)" or "program code(s)." The computer programs typically comprise one or more instructions set at various times in various memory and storage devices in a computing device or computer, and that, when read and executed by one or more processors in the computer, cause the computer to perform operations necessary to execute elements involving the various aspects of the invention. Moreover, while the invention has been described in the context of fully functioning computers and computer systems, those skilled in the art will appreciate that the various embodiments of the invention are capable of being distributed as a program product in a variety of forms, and that the invention applies equally regardless of the particular type of machine or computer-readable media used to actually effect the distribution. Examples of computer-readable media include but are not limited to recordable type media such as volatile and non-volatile memory devices, floppy and other removable disks, hard disk drives, optical disks (e.g., Compact Disk Read-Only Memory (CD-ROMS), Digital Versatile Disks, (DVDs), etc.), and digital and analog communication media.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

A software component may be stored as a file or other data storage construct. Software components of a similar type or functionally related may be stored together such as, for example, in a particular directory, folder, or library. Software components may be static (for example, pre-established or fixed) or dynamic (for example, created or modified at the time of execution).

Software components may invoke or be invoked by other software components through any of a wide variety of mechanisms. Invoked or invoking software components may comprise other custom-developed application software, operating system functionality (for example, device drivers, data storage (for example, file management) routines, other common routines and services, etc.), or third-party software components (for example, middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Although the present invention has been described with reference to specific exemplary embodiments, it will be evident that the various modification and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention.

What is claimed is:

1. A method for generating a multi-model ensemble of global climate simulation data from a plurality of pre-existing global climate simulation model (GCM) datasets, and for training a neural network (NN)-based climate forecasting model, comprising:
    pre-training the NN-based climate forecasting model using reanalysis data or pre-existing image recognition data, wherein the NN-based climate forecasting model comprises a predictive neural network;
    computing a GCM dataset validation measure, for each of the plurality of pre-existing GCM datasets, based on at least one sample statistic for at least one climate variable from the pre-existing GCM dataset;
    selecting a validated subset of the plurality of pre-existing GCM datasets, by comparing each computed GCM dataset validation measure to a validation threshold determined based on a set of observational historical climate data;
    computing a forecast skill score for each validated GCM dataset based on the NN-based climate forecasting model;
    selecting a validated and skillful subset of GCM datasets by choosing at least two best-scored GCM datasets;
    generating one or more candidate ensembles of global climate simulation data, by combining at least two validated and skillful GCM datasets from the validated and skillful subset of GCM datasets;
    computing an ensemble forecast skill score for each candidate ensemble of global climate simulation data based on the NN-based climate forecasting model;
    generating the multi-model ensemble of global climate simulation data by selecting a best-scored candidate ensemble of global climate simulation data; and
    training the NN-based climate forecasting model using the multi-model ensemble of global climate simulation data generated from the plurality of pre-existing GCM datasets.

2. The method of claim 1, wherein the NN-based climate forecasting model is selected from the group consisting of a Convolutional Recurrent Neural Network (CRNN) having at least one Long Short-Term Memory (LSTM) layer, a Spherical Convolutional Neural Network ($S^2$-CNN), and a transformer neural network.

3. The method of claim 1, wherein the validation threshold is determined by computing the at least one sample statistic for the at least one climate variable from the set of observational historical climate data.

4. The method of claim 1, wherein the at least one climate variable is an input climate variable to the NN-based climate forecasting model, and wherein the NN-based climate forecasting model forecasts the target output variable at a target lead time from the input climate variable.

5. The method of claim 1, wherein the observational historical climate data comprises reanalysis data.

6. The method of claim 1, wherein the combining the at least two validated and skillful GCM datasets comprises at least one of concatenating and interleaving the at least two validated and skillful GCM datasets.

7. A system for generating a multi-model ensemble of global climate simulation data from a plurality of pre-existing global climate simulation model (GCM) datasets, and for training a neural network (NN)-based climate forecasting model, comprising:
   at least one processor; and
   a non-transitory physical storage medium for storing program code and accessible by the processor, the program code when executed by the processor causes the processor to:
      pre-train the NN-based climate forecasting model using reanalysis data or pre-existing image recognition data, wherein the NN-based climate forecasting model comprises a predictive neural network;
      compute a GCM dataset validation measure, for each of the plurality of pre-existing GCM datasets, based on at least one sample statistic for at least one climate variable from the pre-existing GCM dataset;
      select a validated subset of the plurality of pre-existing GCM datasets, by comparing each computed GCM dataset validation measure to a validation threshold determined based on a set of observational historical climate data;
      compute a forecast skill score for each validated GCM dataset based on the NN-based climate forecasting model;
      select a validated and skillful subset of GCM datasets by choosing at least two best-scored GCM datasets;
      generate one or more candidate ensembles of global climate simulation data, by combining at least two validated and skillful GCM datasets from the validated and skillful subset of GCM datasets;
      compute an ensemble forecast skill score for each candidate ensemble of global climate simulation data based on the NN-based climate forecasting model;
      generate the multi-model ensemble of global climate simulation data by selecting a best-scored candidate ensemble of global climate simulation data; and
      train the NN-based climate forecasting model using the multi-model ensemble of global climate simulation data generated from the plurality of pre-existing GCM datasets.

8. The system of claim 7, wherein the NN-based climate forecasting model is selected from the group consisting of a Convolutional Recurrent Neural Network (CRNN) having at least one Long Short-Term Memory (LSTM) layer, a Spherical Convolutional Neural Network ($S^2$-CNN), and a transformer neural network.

9. The system of claim 7, wherein the validation threshold is determined by computing the at least one sample statistic for the at least one climate variable from the set of observational historical climate data.

10. The system of claim 7, wherein the at least one climate variable is an input variable to the NN-based climate forecasting model, and wherein the NN-based climate forecasting model forecasts the target output variable at a target lead time from the input climate variable.

11. The system of claim 7, wherein the observational historical climate data comprises reanalysis data.

12. The system of claim 7, wherein the program code to combine the at least two validated and skillful GCM datasets comprises program code for at least one of concatenating and interleaving the at least two validated and skillful GCM datasets.

13. A non-transitory physical storage medium for generating a multi-model ensemble of global climate simulation data from a plurality of pre-existing global climate simulation model (GCM) datasets, and for training a neural network (NN)-based climate forecasting model, the storage medium comprising program code stored thereon, that when executed by a processor causes the processor to:
   pre-train the NN-based climate forecasting model using reanalysis data or pre-existing image recognition data, wherein the NN-based climate forecasting model comprises a predictive neural network;
   compute a GCM dataset validation measure, for each of the plurality of pre-existing GCM datasets, based on at least one sample statistic for at least one climate variable from the pre-existing GCM dataset;
   select a validated subset of the plurality of pre-existing GCM datasets, by comparing each computed GCM dataset validation measure to a validation threshold determined based on a set of observational historical climate data;
   compute a forecast skill score for each validated GCM dataset based on the NN-based climate forecasting model;
   select a validated and skillful subset of GCM datasets by choosing at least two best-scored GCM datasets;
   generate one or more candidate ensembles of global climate simulation data, by combining at least two validated and skillful GCM datasets from the validated and skillful subset of GCM datasets;
   compute an ensemble forecast skill score for each candidate ensemble of global climate simulation data based on the NN-based climate forecasting model;
   generate the multi-model ensemble of global climate simulation data by selecting a best-scored candidate ensemble of global climate simulation data; and
   train the NN-based climate forecasting model using the multi-model ensemble of global climate simulation data generated from the plurality of pre-existing GCM datasets.

14. The non-transitory physical storage medium of claim 13, wherein the NN-based climate forecasting model is selected from the group consisting of a Convolutional Recurrent Neural Network (CRNN) having at least one Long Short-Term Memory (LSTM) layer, a Spherical Convolutional Neural Network ($S^2$-CNN), and a transformer neural network.

15. The non-transitory physical storage medium of claim 13, wherein the validation threshold is determined by computing the at least one sample statistic for the at least one climate variable from the set of observational historical climate data.

16. The non-transitory physical storage medium of claim 13, wherein the at least one climate variable is an input climate variable to the NN-based climate forecasting model, and wherein the NN-based climate forecasting model forecasts the target output variable at a target lead time from the input climate variable.

17. The non-transitory physical storage medium of claim 13, wherein the observational historical climate data comprises reanalysis data.

18. The non-transitory physical storage medium of claim 13, wherein the combining the at least two validated and skillful GCM datasets comprises at least one of concatenating and interleaving the at least two validated and skillful GCM datasets.

* * * * *